United States Patent
Chen et al.

(10) Patent No.: US 12,078,933 B2
(45) Date of Patent: Sep. 3, 2024

(54) SYSTEM AND METHOD FOR OMNIDIRECTIONAL REAL TIME DETECTION OF PHOTOLITHOGRAPHY CHARACTERISTICS

(71) Applicant: Taiwan Semiconductor Manufacturing Co., Ltd., Hsinchu (TW)

(72) Inventors: Tai-Yu Chen, Hsinchu (TW); Shang-Chieh Chien, Hsinchu (TW); Sheng-Kang Yu, Hsinchu (TW); Li-Jui Chen, Hsinchu (TW); Heng-Hsin Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 404 days.

(21) Appl. No.: 17/501,848

(22) Filed: Oct. 14, 2021

(65) Prior Publication Data

US 2022/0269182 A1     Aug. 25, 2022

Related U.S. Application Data

(60) Provisional application No. 63/151,216, filed on Feb. 19, 2021.

(51) Int. Cl.
G03F 7/00       (2006.01)
G06N 20/00     (2019.01)

(52) U.S. Cl.
CPC ...... *G03F 7/70033* (2013.01); *G03F 7/70025* (2013.01); *G03F 7/709* (2013.01); *G06N 20/00* (2019.01)

(58) Field of Classification Search
CPC ... G03F 7/70033; G03F 7/70025; G03F 7/709
USPC ............................ 250/492.1, 493.1, 504 R
See application file for complete search history.

(56) References Cited

U.S. PATENT DOCUMENTS

2002/0060296 A1\* 5/2002 Van Der Veen .... G03F 7/70558
                                                              250/492.1
2007/0001130 A1\* 1/2007 Bykanov ................ H05G 2/001
                                                              250/493.1

FOREIGN PATENT DOCUMENTS

TW    202002130 A    1/2020
TW    202105072 A    2/2021

\* cited by examiner

*Primary Examiner* — Nicole M Ippolito
(74) *Attorney, Agent, or Firm* — Seed IP Law Group LLP

(57) ABSTRACT

An extreme ultraviolet (EUV) photolithography system generates EUV light by irradiating droplets with a laser. The system includes a collector and a plurality of vibration sensors coupled to the collector. The vibration sensors generate sensor signals indicative of shockwaves from laser pulses and impacts from debris. The system utilizes the sensor signals to improve the quality of EUV light generation.

20 Claims, 22 Drawing Sheets

SYSTEM AND METHOD FOR OMNIDIRECTIONAL REAL TIME DETECTION OF PHOTOLITHOGRAPHY CHARACTERISTICS

BACKGROUND

There has been a continuous demand for increased computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

The features in an integrated circuit are produced, in part, with the aid of photolithography. Traditional photolithography techniques include generating a mask outlining the pattern of features to be formed on an integrated circuit die. The photolithography light source irradiates the integrated circuit die through the mask. The size of the features that can be produced via photolithography of the integrated circuit die is limited, in part, on the lower end, by the wavelength of light produced by the photolithography light source. Smaller wavelengths of light can produce smaller feature sizes.

Extreme ultraviolet (EUV) light is used to produce particularly small features due to the relatively short wavelength of EUV light. For example, EUV light is typically produced by irradiating droplets of selected materials with a laser beam. The energy from the laser beam causes the droplets to enter a plasma state. In the plasma state, the droplets emit EUV light. The EUV light travels toward a collector with an elliptical or parabolic surface. The collector reflects the EUV light to a scanner. The scanner illuminates the target with the EUV light via a reticle. However, if the droplets are not properly formed and irradiated, then there may be insufficient EUV light to perform an EUV process. Accordingly, the photolithography processes may fail and the resulting integrated circuits will not be functional.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
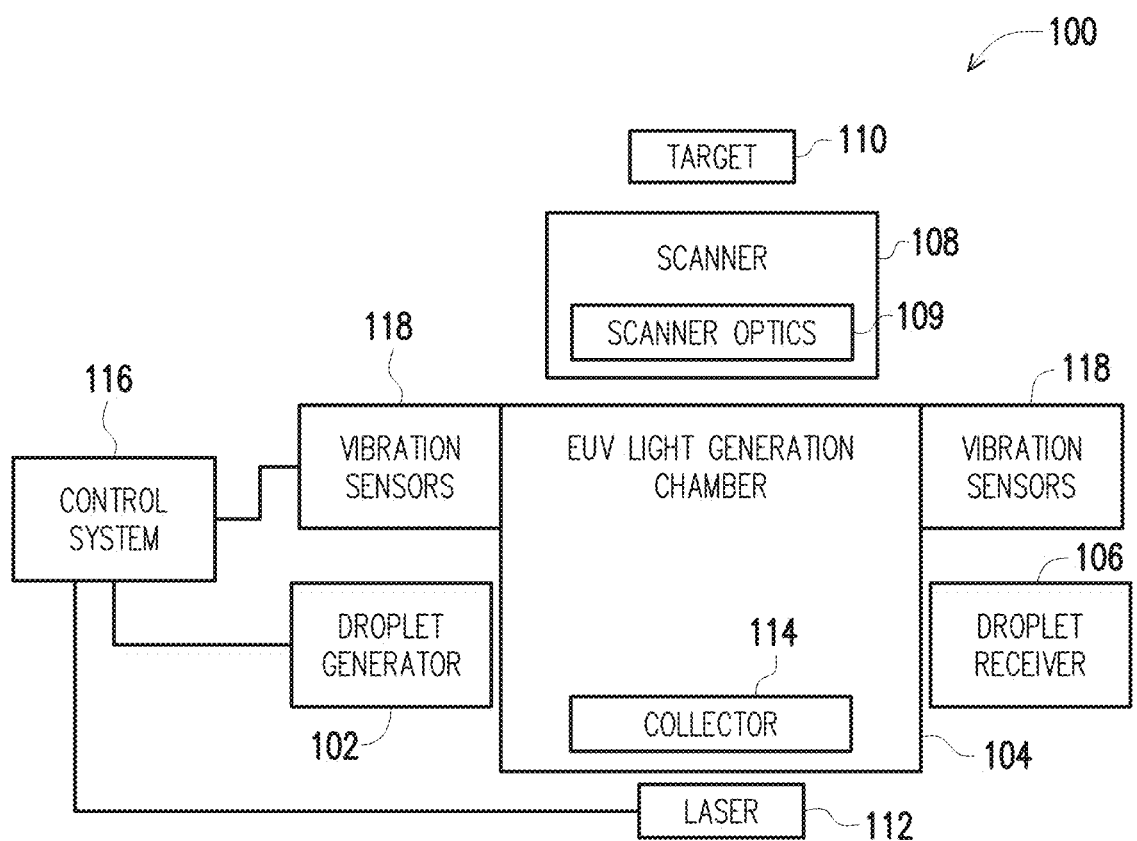
FIG. 1 is a block diagram of an EUV photolithography system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide many benefits to EUV photolithography systems. Embodiments of the present disclosure utilize vibration sensors coupled to the surfaces of an EUV light generation chamber in order to determine characteristics of EUV light generation and debris distribution. The vibration sensors can detect characteristics of shockwaves resulting from the irradiation of droplets by a laser. The vibration sensors can also detect the distribution of scattered debris on surfaces within the EUV light generation chamber. Based on this information, a control system can construct a model of the plasma generated from the droplets by irradiation from the laser. The control system utilizes machine learning processes to determine adjustments that can be made to improve plasma generation based on the plasma model. The control system then adjusts aspects of the EUV system in order to improve EUV light generation. The result is that photolithography processes are properly performed, leading to increases in wafer yields and better performance of integrated circuits. Furthermore, collector mirrors will not need to undergo extensive cleaning procedures or be replaced.

FIG. 1 is a block diagram of an EUV photolithography system 100, according to some embodiments. The components of the EUV photolithography system 100 cooperate to generate EUV light and perform photolithography processes. As will be set forth in more detail below, the components of the photolithography system utilize vibration sensors and machine learning techniques to improve the generation of EUV light. As used herein, the terms "EUV light" and "EUV radiation" can be used interchangeably.

The EUV photolithography system 100 includes a droplet generator 102, an EUV light generation chamber 104, a droplet receiver 106, a scanner 108, a laser 112, and a collector 114. The droplet generator 102 outputs droplets into the EUV light generation chamber 104. The laser 112 irradiates the droplets with pulses of laser light within the EUV light generation chamber 104. The irradiated droplets emit EUV light. The EUV light is collected by a collector 114 and reflected toward the scanner 108. The scanner 108 conditions the EUV light and focuses the EUV light onto the target 110. The target 110 may include a semiconductor wafer. After irradiation by the laser 112, the droplets exit the EUV light generation chamber 104 and are received by the droplet receiver 106. Further details regarding each of these components and processes are provided below.

The droplet generator 102 generates and outputs a stream of droplets. The droplets can include tin, though droplets of other material can be utilized without departing from the scope of the present disclosure. The droplets move at a high rate of speed toward the droplet receiver 106. The droplets have an average velocity between 60 m/s to 200 m/s. The droplets have a diameter between 10 μm and 200 μm. The generator may output between 1000 and 100000 droplets per second. The droplet generator 102 can generate droplets having different initial velocities and diameters than those described above without departing from the scope of the present disclosure.

In some embodiments, the EUV light generator 102 is a laser produced plasma (LPP) EUV light generation system. As the droplets travel through the EUV light generation chamber 104 between the droplet generator 102 and the droplet receiver 106, the droplets are irradiated by the laser 112. When a droplet is irradiated by the laser 112, the energy from the laser 112 causes the droplet to form a plasma. The plasmatized droplets generate EUV light. This EUV light is collected by the collector 114 and passed to the scanner 108 and then on to the target 110.

In some embodiments, the laser 112 is positioned external to the EUV light generation chamber 104. During operation, the laser 112 outputs pulses of laser light into the EUV light generation chamber 104. The pulses of laser light are focused on a point through which the droplets pass on their way from the droplet generator 102 to the droplet receiver 106. Each pulse of laser light is received by a droplet. When the droplet receives the pulse of laser light, the energy from the laser pulse generates a high-energy plasma from the droplet. The high-energy plasma outputs EUV light.

In some embodiments, the laser 112 irradiates the droplet with two pulses. A first pulse causes the droplet to flatten into a disk like shape. The second pulse causes the droplet to form a high temperature plasma. The second pulse is significantly more powerful than the first pulse. The laser 112 and the droplet generator 102 are calibrated so that the laser emits pairs of pulses such that the droplet is irradiated with a pair of pulses. The laser can irradiate droplets in a manner other than described above without departing from the scope of the present disclosure. For example, the laser 112 may irradiate each droplet with a single pulse or with more pulses than two. In some embodiments, there are two separate lasers. A first laser delivers the flattening pulse. A second laser delivers the plasmatizing pulse.

In some embodiments, the light output by the droplets scatters randomly in many directions. The photolithography system 100 utilizes the collector 114 to collect the scattered EUV light from the plasma and output the EUV light toward the scanner 108.

The scanner 108 includes scanner optics 109. The scanner optics 109 include a series of optical conditioning devices to direct the EUV light to the reticle. The scanner optics 109 may include refractive optics such as a lens or a lens system having multiple lenses (zone plates). The scanner optics 109 may include reflective optics, such as a single mirror or a mirror system having multiple mirrors. The scanner optics 109 direct the ultraviolet light from the EUV light generator 102 to a reticle.

The ultraviolet light reflects off of the reticle back toward further optical features of the scanner optics 109. In some embodiments, the scanner optics 109 include a projection optics box. The projection optics box may have refractive optics, reflective optics, or combination of refractive and reflective optics. The projection optics box may include a magnification less than 1, thereby reducing the patterned image included in the EUV light reflected from the reticle. The projection optics box directs the EUV light onto the target 110, for example, a semiconductor wafer.

The EUV light includes a pattern from the reticle. In particular, the reticle includes the pattern to be defined in the target 110. After the EUV light reflects off of the reticle, the EUV light contains the pattern of the reticle. A layer of photoresist typically covers the target during extreme ultraviolet photolithography irradiation. The photoresist assists in patterning a surface of the semiconductor wafer in accordance with the pattern of the reticle.

The effectiveness of the photolithography processes performed with the reticle depend, in large part, on the quality of EUV light generation in the EUV light generation chamber 104. The quality of EUV light generated within the EUV light generation chamber 104 is affected by various parameters or characteristics of components of the EUV light generation system 100. Some of these characteristics are related to characteristics of the droplets, characteristics of the laser pulses, and characteristics of interior surfaces of the EUV light generation chamber 104. As set forth previously, EUV light is generated from a droplet by first irradiating the droplet with a flattening laser pulse and then generating a plasma from the flattened droplet by irradiating the droplets with a plasmatized laser pulse. When the droplet is in a plasma state, the droplet emits EUV light. The light scatters, is collected by the collector 114, and reflected by the collector 114 onward to the scanner 108.

It is beneficial to generate a very large amount of EUV light from each droplet. It is also beneficial if the EUV light scatters from the droplet with radial symmetry around an axis corresponding to the plasmatized laser pulse. It is also beneficial if the surface of the collector 114 is free from debris so that reflectivity of the collector 114 is high. It is also beneficial for the other interior surfaces of the plasma generation chamber 104 to be free from debris.

One characteristic that may heavily affect EUV light generation is the effectiveness of the flattening pulse on the droplets. The flattening pulse from the laser 112 causes the droplet to flatten into a disk or pancake shape. It is desirable for the bottom surface of the flattened droplet to be nearly horizontal in the X-Y plane, or nearly perpendicular to the direction of travel of the laser pulse. This is most likely to occur if the flattening pulse is centered on the center of the bottom hemispherical surface of the droplet. If the flattening pulse strikes the droplet off center, then the bottom flattened surface of the droplet will be tilted an undesirable amount relative to the horizontal plane. As will be set forth in more detail below, this results in undesirable EUV light generation qualities. Whether or not the flattening pulse has the desired effect depends, in part, on the speed of the droplets, the size of the droplets, the timing of the flattening pulse, and the energy of the flattening pulse.

Another characteristic that may heavily affect EUV light generation is the effectiveness of the plasmatizing pulse. It is desirable for the plasmatizing pulse to be centered on the center of the bottom surface of the flattened droplet, with the bottom surface lying nearly in the horizontal plane. If the plasmatizing pulse strikes the droplet off center, then the droplet may not be fully plasmatized. Furthermore, debris may be ejected from the droplet in various directions, contaminating the surface of the collector 114 and other interior surfaces of the EUV light generation chamber 104. A reduced amount of EUV light may be generated by the imperfectly plasmatized droplet. The EUV light may also scatter with an undesired profile. Whether or not the plasmatizing pulse fully and effectively plasmatizing is the droplet depends, in part, on the speed of the droplets, the size of the droplets, the timing of the plasmatizing pulse, and the energy of the plasmatizing pulse.

The EUV photolithography system 100 utilizes the vibration sensors 118 and the control system 116 to determine current EUV light generation quality and to adjust the EUV light generation parameters to improve EUV light generation. As will be set forth in more detail below, the vibration sensors 118 detect vibrations of the collector 114 and other surfaces of the EUV radiation generation chamber 104. The vibration sensors 118 generate sensor signals indicative of the vibrations and pass the sensor signals to the control system 116. The control system 116 analyzes the sensor signals and generates EUV adjustment data indicating adjustments to EUV light generation parameters in order to improve EUV light generation.

A large number of vibration sensors 118 may be distributed on outer surface of the EUV light generation chamber 104. In many cases, the outer surface of the collector 114 is part of the outer surface of the EUV light generation chamber 104. Accordingly, a plurality of the vibration sensors 118 may be distributed on the outer surface of the collector 114.

Each vibration sensor 118 senses vibration of the surface of the EUV light generation chamber 104 within the vicinity of the vibration sensor 118. Vibrations may be generated by the debris from the droplets impacting the interior surfaces of the EUV light generation chamber 104 as a result of the plasmatizing pulse or the flattening pulse impacting the droplet. These impacts impart a large amount of energy to the droplets and eject debris from the droplets. The time-of-flight of the debris may be calculated based on the sensor signals and the known timing of the laser pulses. The vibration sensors 118 may also detect shockwaves emitted from the droplets responsive to irradiation from the laser pulses. The shockwaves will have particular directionality based on the orientation of the droplets, such as the orientations of the surfaces of the flattened droplets. The vibration sensor signals are passed from the vibration sensors 118 to the control system 116.

The control system 116 analyzes the sensor signals. Based on the sensor signals, the control system 116 can determine the time-of-flight of droplet debris. The control system 116 can also determine the distribution of debris across the interior surfaces of the EUV light generation chamber 104. The control system 116 can utilize this information in order to construct a 3D model of the plasmatized droplets.

The control system 116 can utilize machine learning processes to understand the laser plasma interaction. The machine learning processes can utilize a large number of EUV light generation parameters such as droplet speed, droplet size, flattening pulse timing, flattening pulse energy, plasmatizing pulse timing, plasmatizing pulse energy, debris distribution, shockwave distribution, and other parameters in order to learn how the parameters work together to create the plasma and how they affect the overall EUV light generation. The machine learning processes can enable the control system 116 to pick good EUV light generation parameters to improve the quality and stability of the EUV system 100. Furthermore, the control system can predict contamination distribution in an EUV system. This can enable proactive cleaning action to clean highly contaminated areas of the collector 114 or other interior surfaces of the EUV light generation chamber 104.

The orientation of the surface of the flattened droplet and droplet contamination distribution are positively correlated. In particular, a relatively large amount of contamination occurs in the direction facing the flattened surface of the flattened droplet.

Accordingly, the control system 116 and the vibration sensors 118 provide real-time omnidirectional correct plasma conditions and droplet debris formation and distribution. Utilizing the machine learning and big data analysis, the control system 116 can effectively improve EUV power, droplet contamination, and EUV energy stability. The control system 116 can also utilize deep learning for efficient EUV light generation, power decay and dose error control. Further details regarding the machine learning processes is set forth below in relation to FIGS. 14 and 15.

Figure 2A:
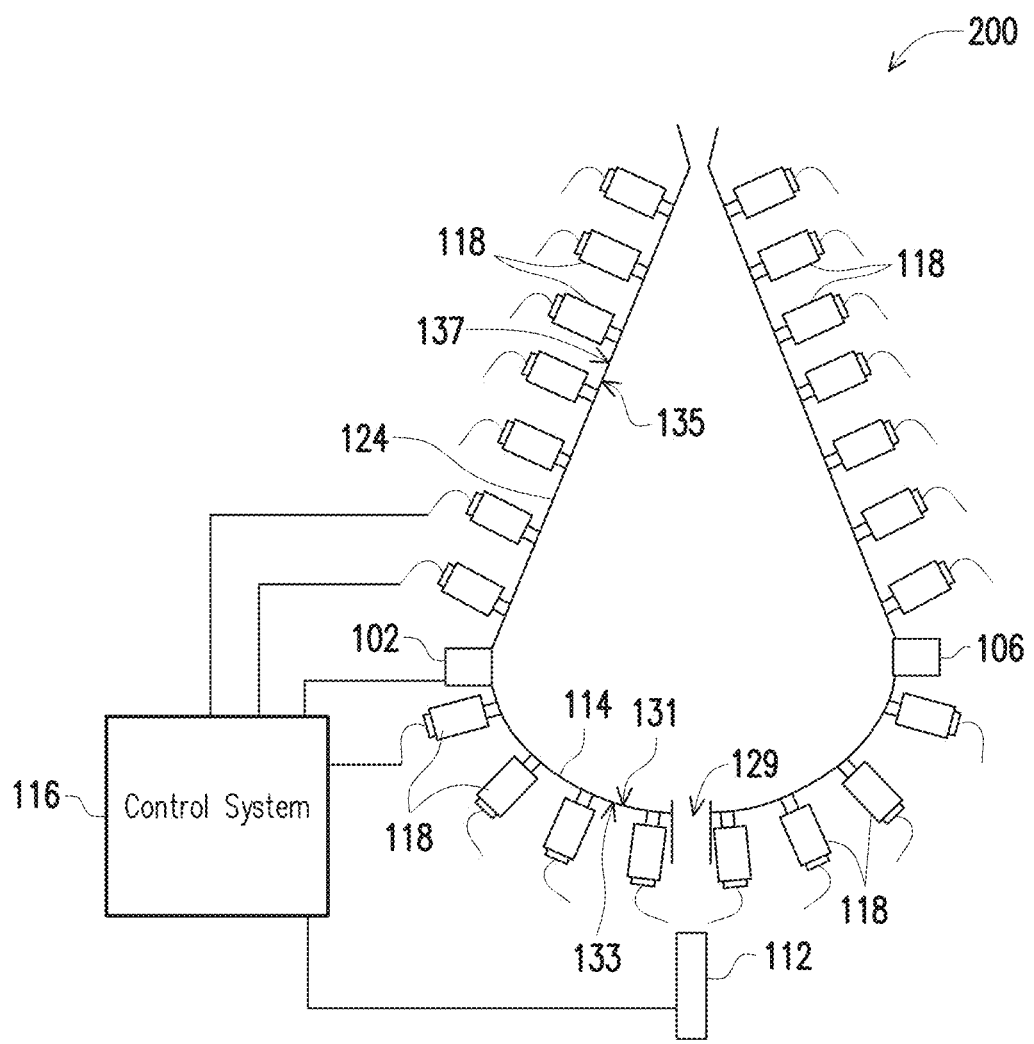
FIGS. 2A-2B are illustrations of a photolithography system, in accordance with some embodiments.
Figure 2B:
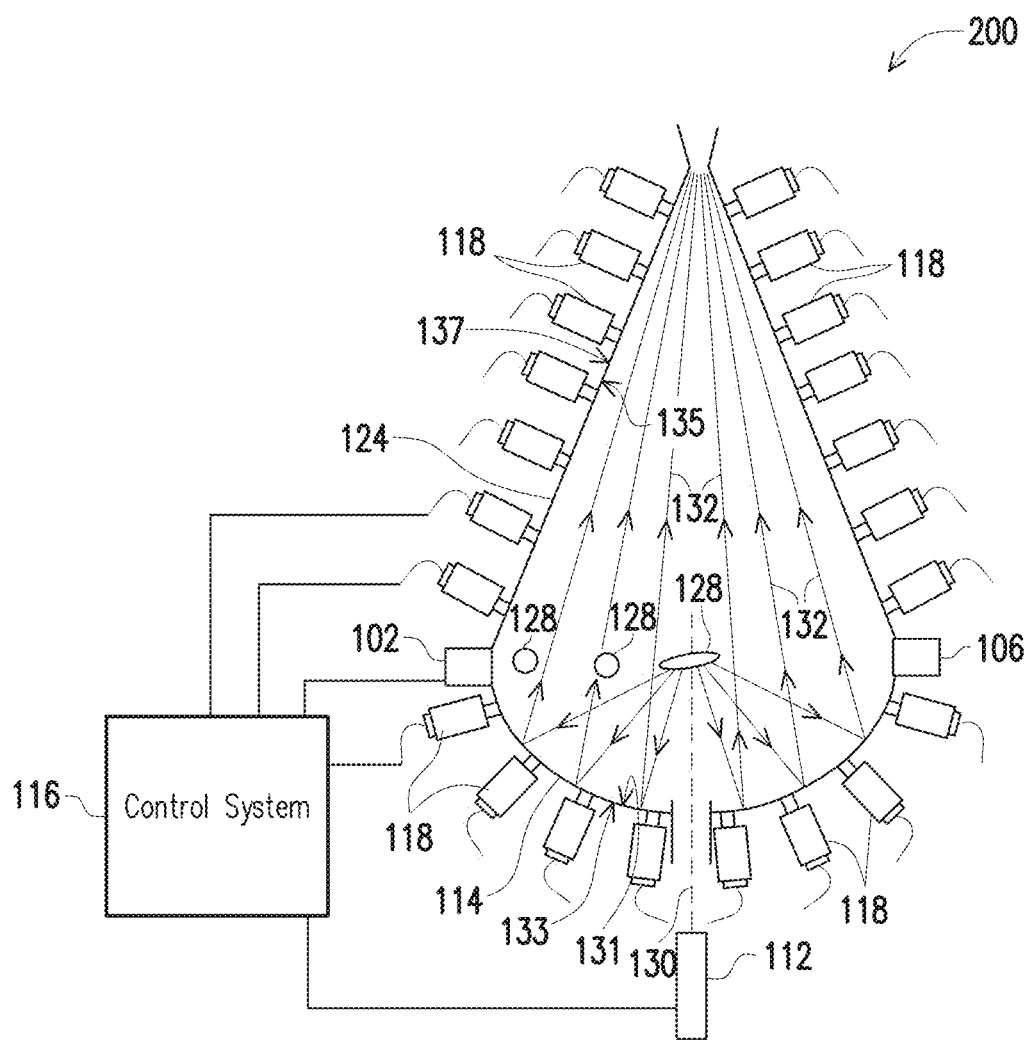

FIGS. 2A-2B are illustrations of a photolithography system 200, according to an embodiment. The photolithography system 200 is an extreme ultraviolet photolithography system that generates extreme ultraviolet radiation by laser plasma interaction. The plasma can be generated in a substantially similar manner as described in relation to FIG. 1. FIG. 2A illustrates the photolithography system 200 without the extreme ultraviolet radiation. FIG. 2B illustrates the photolithography system 200 with the extreme ultraviolet radiation.

With reference to FIG. 2A, the photolithography system 200 includes a plasma generation chamber 104, a laser 112, a collector 114, a droplet generator 102, and a droplet receiver 106. The EUV light generation chamber 104 is defined by the collector 114 and an enclosure 124 coupled to the collector 114. The components of the photolithography system 200 cooperate together to generate extreme ultraviolet radiation and to perform photolithography processes with the extreme ultraviolet radiation.

The collector 114 forms the bottom of the EUV light generation chamber 104. The conical enclosure 124 is coupled to the collector 114 and forms the top portion of the EUV light generation chamber 104. The collector 114 includes an interior surface 131 and an exterior surface 133. The conical enclosure 124 includes an interior surface 135 and an exterior surface 137.

A plurality of vibration sensors are coupled to the EUV light generation chamber 104. In particular, vibration sensors 118 are distributed across the exterior surface 133 of the collector 114. The vibration sensors 118 are also distributed across the exterior surface 137 of the enclosure 124. The vibration sensors 118 are sensitive enough to sense vibrations at the interior surfaces 131 and 135 of the collector 114 and the enclosure 124 due to debris and shockwaves, as will be described in more detail below.

The droplet generator 102 generates and outputs droplets 128. The droplets can include, tin, though droplets of other material can be utilized without departing from the scope of the present disclosure. The droplets 128 move at a high rate of speed toward the droplet receiver 106.

The droplet generator 102 periodically emits a droplet 128. The view of FIG. 2B illustrates three droplets 128. One of the droplets is at a laser irradiation point location within the EUV light generation chamber 104.

After passing through the laser irradiation point, the coalesced droplets 128 are received by the droplet receiver 106. The droplet receiver 106 may include a droplet reservoir. The droplets 128 travel into the droplet receiver 106, impact a back wall of the droplet receiver 106, and drop into the droplet reservoir. Other configurations for a droplet receiver 106 can be utilized without departing from the scope of the present disclosure The laser 112 is positioned behind the collector 114. During operation, the laser 112 outputs pulses of laser light 130. The pulses of laser light 130 are focused on a point through which the droplets pass on their way from the droplet generator 102 to the droplet receiver 106. Each pulse of laser light 130 is received by a droplet 128 at the laser irradiation point. When a droplet 128 receives the pulse of laser light 130, the energy from the laser pulse generates a high-energy plasma from the droplet 128. The high-energy plasma outputs extreme ultraviolet radiation.

In some embodiments, the laser 112 is a carbon dioxide ($CO_2$) laser. The $CO_2$ laser emits radiation or laser light 130 with a wavelength centered around 9.4 μm or 10.6 μm. The laser 112 can include lasers other than carbon dioxide lasers and can output radiation with other wavelengths than those described above without departing from the scope of the present disclosure.

In some embodiments, the laser 112 irradiates each droplet 128 with two pulses. A first pulse causes the droplet 128 to flatten into a disk like shape. The first pulse may be termed a "flattening pulse". The second pulse may be termed a "plasmatizing pulse". The second pulse causes the droplet 128 to form a high temperature plasma. The second pulse is significantly more powerful than the first pulse. The laser 112 and the droplet generator 102 are calibrated so that the laser 112 emits pairs of pulses such that each droplet 128 is irradiated with a pair of pulses.

In the example of FIG. 2A, the droplet 128 at the laser irradiation point has been irradiated by the flattening pulse. The irradiated droplet 128 is flattened into the general shape of a disk. In the view of FIG. 2A, the flattened droplet is tilted relative to horizontal.

Although FIG. 2A illustrates a single laser 112, in practice there may be two lasers. The first laser may emit the flattening pulse. The second laser may emit the plasmatizing pulse.

The laser 112 can irradiate droplets 128 in a manner other than described above without departing from the scope of the present disclosure. For example, the laser 112 may irradiate each droplet 128 with a single pulse or with more pulses than two. Moreover, the primary laser here can not only cause the droplet to form into a disk-like shape but also may cause the droplet to form into a mist or vapor state.

FIG. 2B illustrates EUV light 132 being emitted from the droplet 128 receiving the laser light pulse 130. When the droplets 128 are converted to a plasma, the droplets 128 output EUV light 132. In an example in which the droplets 128 are tin, the droplets 128 output EUV light 132 with a wavelength centered between 10 nm and 15 nm. More particularly, in some embodiments, the tin plasma emits EUV light with a central wavelength of 13.5 nm. Materials other than tin can be used for the droplets 128 without departing from the scope of the present disclosure. Such other materials may generate extreme ultraviolet radiation with wavelengths other than those described above without departing from the scope of the present disclosure.

In some embodiments, the EUV light 132 output by the droplets 128 scatters in many directions. The photolithography system 100 utilizes the collector 114 to collect the scattered EUV light 132 from the plasma and output the EUV light 132 toward a photolithography target.

In some embodiments, the collector 114 is a parabolic or elliptical mirror. The scattered EUV light 132 is collected and reflected by the parabolic or elliptical mirror with a trajectory toward a scanner (not shown in FIGS. 2A and 2B). The scanner utilizes a series of optical conditioning devices such as mirrors and lenses to direct the extreme ultraviolet radiation to the photolithography mask. The EUV light 132 reflects off of the mask onto a photolithography target. The EUV light 132 reflected from the mask patterns a photoresist or other material on a semiconductor wafer. For purposes of the present disclosure, particularities of the mask and the various configurations of optical equipment in the scanner are not shown.

In some embodiments, the collector 114 includes a central aperture 129. The pulses of laser light 130 pass from the laser 112 through the central aperture 129 toward the stream of droplets 128. This enables the collector 114 to be positioned between the laser 112 and the scanner.

When the plasmatizing laser pulse irradiates the flattened droplet 128, the flattened droplet 128 will become a plasma. The energy of the plasmatizing pulse also causes particles from the plasmatized droplet 128 to scatter from the flattened droplet. Some of the particles from the plasmatized droplet 128 will land on the interior surface 131 of the collector mirror 114. Some of the particles from the plasmatized droplet 128 will land on the interior surface 135 of the conical closure 124. These droplet particles are debris that contaminate the collector mirror 114 and the conical closure 124. An accumulation of this debris may significantly reduce the reflectivity of the interior surface 131 of the collector 114.

Great efforts may be taken to clean the debris from the interior surface 131 of the collector 114 and from the interior surface 135 of the conical closure 124. One solution is to thoroughly clean all areas of the interior surfaces 131 and 135. However, this may be very time-consuming and expensive.

As described previously, the scattering pattern of debris from the droplets 128 is built based on and indicative of the shape and orientation of the flattened droplet and the plasmatizing pulse and plasma profile of the droplets 128. Accordingly, debris from the droplets 128 will accumulate in a pattern on the interior surfaces 131 and 135. Some areas may have no debris while other areas have a large amount of debris.

The vibration sensors 118 detect the locations of debris accumulation on the surfaces 131 and 135. When debris impacts an area on the surfaces 131 or 135, the collector 114 or enclosure 124 will vibrate at that location. The vibration sensor 118 at corresponding location on the exterior surface 133 or 137 will sense the vibration and generate sensor signals indicative of the vibration. The sensor signals are passed to the control system 116.

Based on the sensor signals received from the vibration sensors 118, the control system 116 can determine the locations on the interior surfaces 131 and 135 at which debris has accumulated. The control system 116 can direct cleaning operations to those particular locations in order to remove the debris. The cleaning operations can include flowing cleaning fluids onto those locations where debris has accumulated. The cleaning fluids can include hydrogen or other cleaning fluids that can assist in breaking up and removing the debris. The cleaning fluids can be provided via channels, apertures, or vents at the rim of the collector 114. These channels, apertures, or vents can be selectively opened. Other ways of cleaning debris can be utilized without departing from the scope of the present disclosure.

As described previously, the scattering pattern of debris on the interior surfaces 131 and 135 is indicative of the shape and orientation of the flattened droplet, and the plasma profile of the droplet 128 after receiving the plasmatizing pulse. For example, if the plasmatizing pulse is centered on the forward or rearward edge rather than on a center of the flattened surface, only some portions of the droplet 128 may become plasmatized, resulting in large amounts of debris. Accordingly, the scattering pattern of the debris from the droplets 128 is indicative of the portions of the droplets 128 that were plasmatized. The scattering pattern may also be indicative of the shape and orientation of the flattened droplet 128 prior to being irradiated by the plasmatizing pulse.

The control system 116 can generate a 3D model of the plasmatized droplet based on the sensor signals received from the vibration sensors 118. This 3D model can be indicative of how the flattening and plasmatizing pulses are interacting with the droplets. The control system 116 can utilize machine learning models to connect the relationships between the characteristics of the plasmatizing and flattening pulses and the characteristics of the droplets 128. The control system 116 can then determine adjustments that can be made to improve plasmatization and EUV light generation.

Figure 2C:
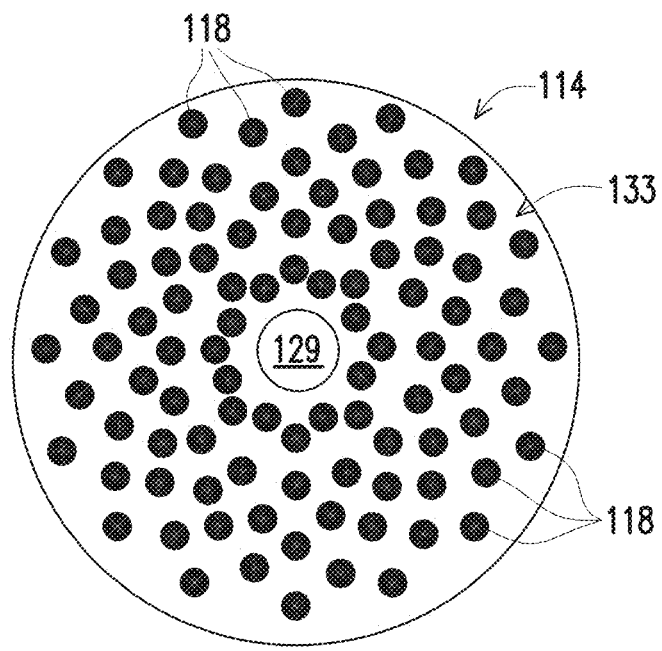
FIG. 2C is a bottom view of the collector of FIGS. 2A and 2B, in accordance with some embodiments.

FIG. 2C is a bottom view of the collector 114 of FIGS. 2A and 2B, in accordance with some embodiments. FIG. 2C illustrates the distribution of vibration sensors 118 on the exterior surface 133 of the collector 114. As can be seen from FIG. 2C, the vibration sensors 118 are distributed at many locations on the exterior surface 133 of the collector 114. In some embodiments, the vibration sensors 118 may be distributed more densely at locations near the aperture 129 and less densely at locations near an outer edge of the collector 114. It may be desirable to distribute vibration sensors 118 more densely at locations that may receive higher amounts of debris.

Figure 2D:
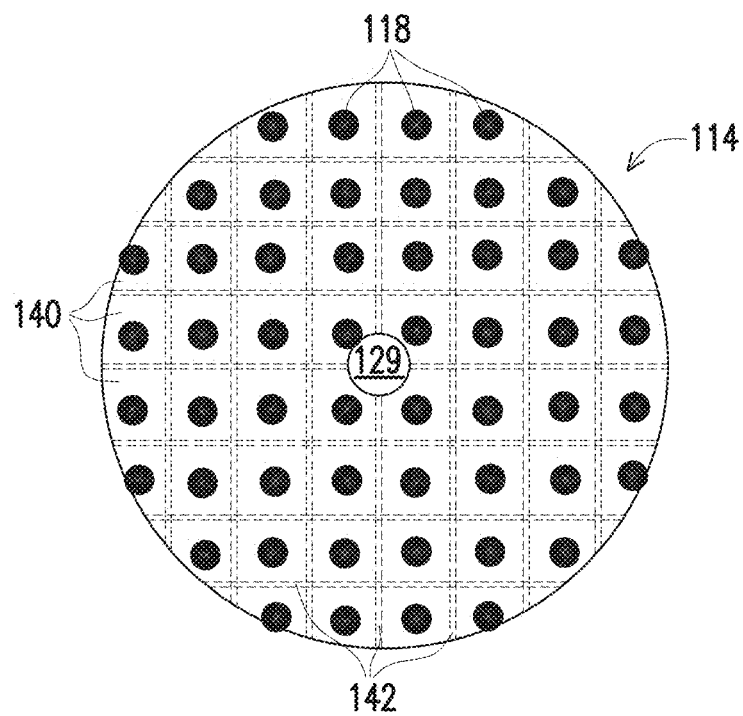
FIG. 2D is a bottom view of the collector of FIGS. 2A and 2B, in accordance with some embodiments.

FIG. 2D is a bottom view of the collector 114 of FIGS. 2A and 2B, in accordance with some embodiments. FIG. 2D illustrates the distribution of vibration sensors 118 on the exterior surface 133 of the collector 114. The collector 114 may be formed of separate mirror units 140. As can be seen from FIG. 2D, the vibration sensors 118 are distributed in a grid pattern on the exterior surface 133 of the collector 114. A respective vibration sensor 118 may be placed at each mirror unit 140.

In some embodiments, the mirror units 140 are delimited or bounded by contraction joints 142. The contraction joints 142 may correspond to locations at which purging fluids or cleaning fluids can be flowed onto the adjacent mirror units 140. The purging fluids can be selectively flowed onto those mirror units 140 at which contamination debris has accumulated. The contraction joints can likewise be utilized to flow purging fluids or cleaning fluids onto mirror units 140 at which accumulation of debris is expected based on known characteristics of the flattening and plasmatizing pulses and the droplets. Various schemes can be utilized for distributing vibration sensors on a bottom surface 133 of the collector 114 without departing from the scope of the present disclosure.

Figure 3:
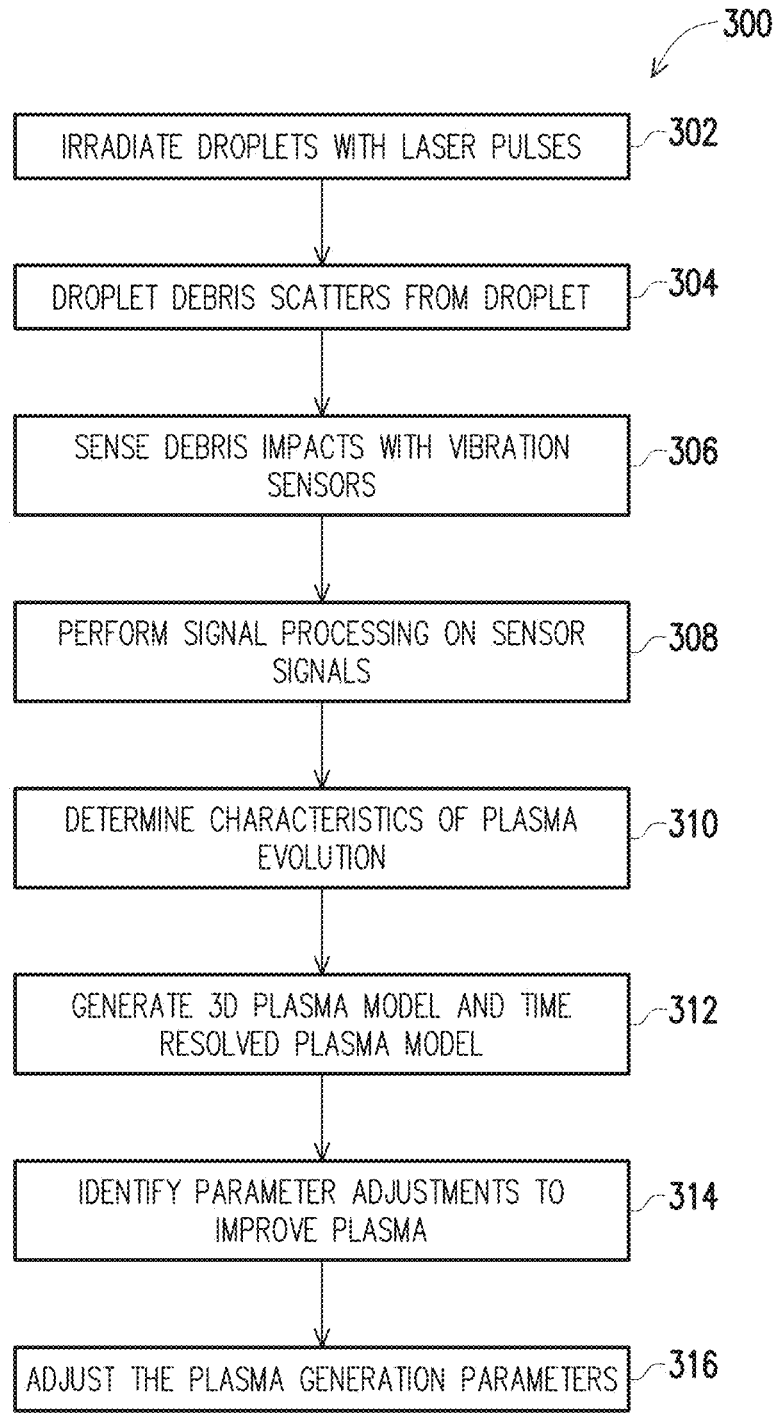
FIG. 3 is a flow diagram of a process for operating an EUV photolithography system, in accordance with some embodiments.

FIG. 3 is a flow diagram of a process for operating an EUV photolithography system, in accordance with some embodiments. The method 300 can utilize processes, structures, and components described previously in relation to FIGS. 1-2D. At 302, the method 300 includes irradiating droplets with laser pulses. One example of droplets are the droplets 128 of FIGS. 2A and 2B. One example of laser pulses is the laser pulse 130 illustrated in FIGS. 2A and 2B. At 304, droplet debris scatters from the droplets. At 306, the method 300 includes sensing debris impacts with vibration sensors. One example of vibration sensors are the vibration sensors 118 of FIG. 2A. At 308, the method 300 includes performing signal processing on the sensor signals generated by the vibration sensors. At 310, the method 300 includes determining characteristics of plasma evolution of the droplets 128 based on the sensor signals. At 312, the method 300 includes generating a 3D plasma model and a time resolved plasma model based on the sensor signals. At 314, the method 300 includes identifying parameter adjustments to improve plasma generation. At 316, the method 300 includes adjusting the plasma generation parameters. Further details regarding each of these steps are provided in subsequent Figures.

Figure 4A:
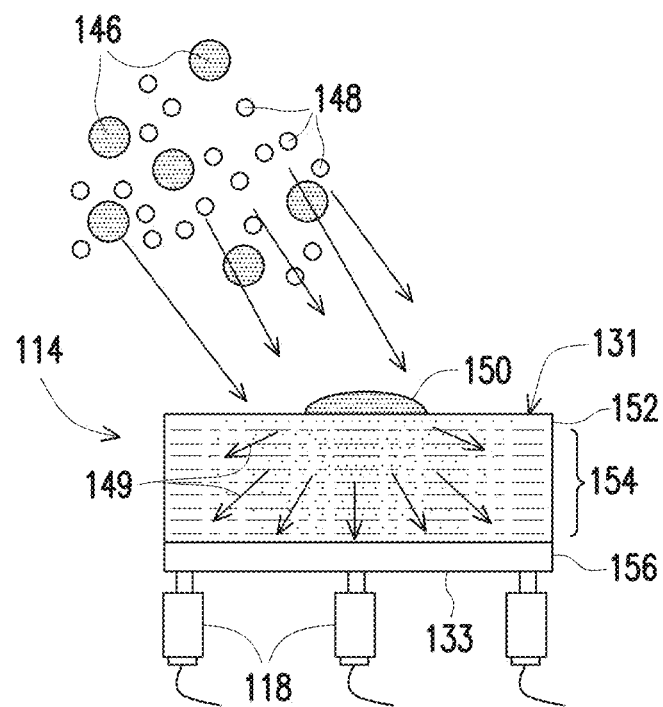
FIG. 4A is an illustration of droplet debris impacting a collector of an EUV light generation system, in accordance with some embodiments.

FIG. 4A is an illustration of droplet debris impacting a collector 114 of an EUV light generation system, in accordance with some embodiments. The collector 114 may include characteristics described in relation to FIGS. 1-2D. FIG. 4A illustrates one example of step 304 of a method 300 of FIG. 3, though FIG. 4 can apply to other methods and processes without departing from the scope of the present disclosure.

In FIG. 4A, a droplet 128 (not shown) has received the plasmatizing laser pulse. A plasma is generated from the droplet 128. Droplet particles 146 and free electrons 148 are ejected from the plasmatized droplet 128. As described previously, the ejection or scattering pattern may be indicative of characteristics of the plasma and the system parameters utilized in generating the plasma. The droplet particles 146 and the free electrons 148 travel toward the interior surface 131 of the collector 114. The droplet particles 146 and the free electrons 148 impact the interior surface 131 of the collector 114. The contamination debris 150 on the interior surface 131 illustrates the accumulation of droplet particles 146 at a particular location on the interior surface 131 of the collector 114.

The impact of the droplet particles 146 and the free electrons 148 results in vibrations 149 propagating through the collector 114 from the interior surface 131 to the exterior surface 133. Vibration sensors 118 coupled to the exterior surface 133 sense the vibrations 149. The vibration sensors 118 generate sensor signals indicating the vibrations. The vibration sensor 118 directly below the impact site will sense stronger vibrations than will the vibration sensors 118 to either side. The sensor signals from these vibration sensors 118 will indicate how close each vibration sensor 118 was to the impact site. Accordingly, the sensor signals indicate the location of the impact site of the contamination debris 150.

The sensor signals generated by the various vibration sensors 118 can indicate the time-of-flight of the droplet particles 146 and the free electrons 148. The distances between the droplet irradiation site and each of the vibration sensors 118 are known. The propagation speed of vibrations through the collector 114 is also known. Accordingly, the sensor signals from the vibration sensors 118 will each sense an impact vibration from a debris particle 146 at a slightly different time. The timing of the sensor signals, together with the known timing of the plasmatizing pulse, indicates the time-of-flight of the droplet particles 146 prior to impact. The time-of-flight indicates the velocities of the droplet particles 146. The velocities of the droplet particles 146 indicate the energies of the droplet particles 146. The energies of the droplet particles 146, in turn, indicate characteristics of the plasma generated from the droplets.

The cross-sectional nature of the view of FIG. 4A illustrates up the collector 114 includes a capping layer 152. The capping layer 152 may include a heat resistant and light permeable material. This enables EUV light to pass through the capping layer 152 so that the EUV light may be reflected by other layers below the capping layer 152. The collector 114 may also include a multilayer structure 154. The multilayer structure 154 may include alternating layers of silicon and molybdenum. Alternatively, the multilayer structure 154 may include other types of layers. The multilayer structure 154 may include layers that both transmit and reflect light. The collector 114 may also include a substrate 156 below the multilayer structure 154. The substrate 156 may include a relatively thick layer of silicon or another suitable material. The substrate 156 may include a highly reflective material to ensure that all EUV light that passes through the capping layer 152 will be reflected toward the scanner 108 (see FIG. 1). The bottom of the substrate 154 corresponds to the exterior surface 133 of the collector 114. The collector 114 can have other structures and materials without departing from the scope of the present disclosure.

In some embodiments in which the droplets 128 are tin, the droplet particles 146 correspond to positively charged tin particles. The positively charged tin particles may include ionized tin atoms or groups of ionized tin atoms. The droplet particles 146 can include other materials based on the material of the droplets 128.

Figure 4B:
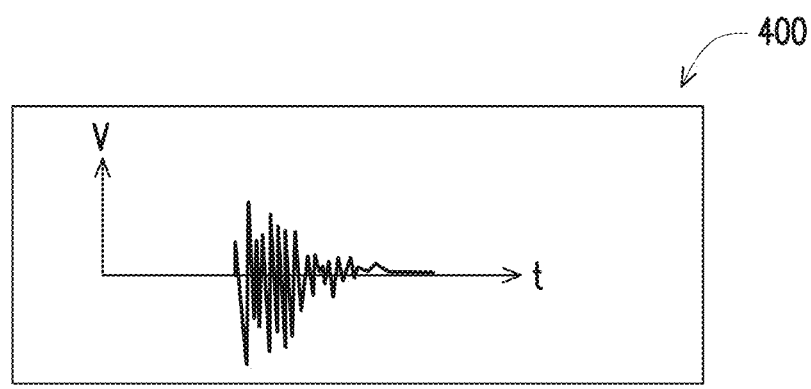
FIG. 4B is a graph illustrating sensor signals provided by one or more of the vibration sensors, in accordance with some embodiments.

FIG. 4B is a graph 400 illustrating sensor signals provided by one or more of the vibration sensors 118, in accordance with some embodiments. The vibration sensors 118 generate voltages responsive to receiving vibrations from debris impacts. Each vibration sensor 118 may record time-of-flight and amplitude information associated with the debris impacts. The sensor signals may have other forms or characteristics without departing from the scope of the present disclosure. The sensor signals illustrated in FIG. 4B may correspond to a superposition of sensor signals from each of a plurality of vibration sensors 118.

Figure 5:
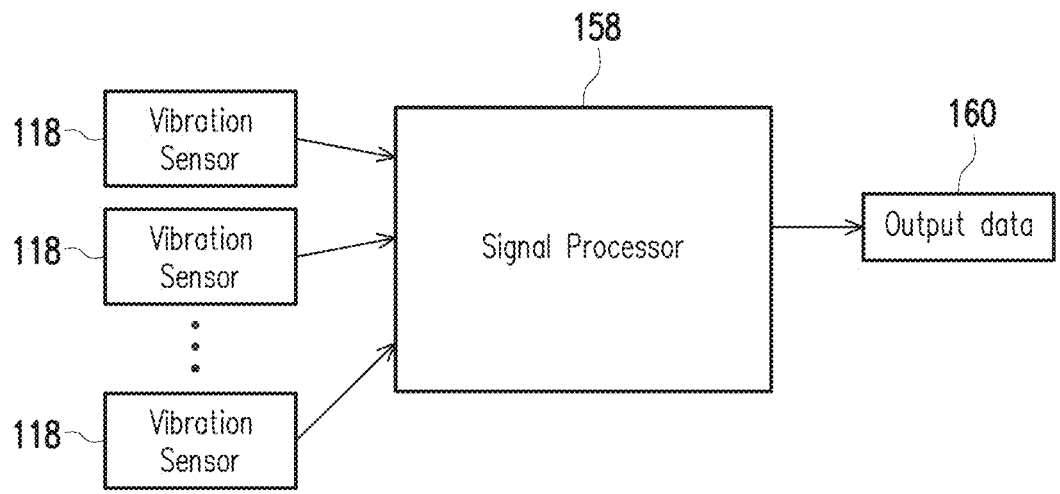
FIG. 5 is a block diagram illustrating vibration sensors coupled to a signal processor, in accordance with some embodiments.

FIG. 5 is a block diagram illustrating vibration sensors 118 coupled to a signal processor 158, in accordance with some embodiments. The signal processor 158 may be part of the control system 116 (see FIGS. 1-2B). Alternatively, the signal processor 158 may be separate from the control system 116. FIG. 5 and the description of FIG. 5 may be particularly relevant to step 308 of the method 300 of FIG. 3, though FIG. 5 and the description of FIG. 5 may be relevant to other systems, methods, and processes without departing from the scope of the present disclosure.

The vibration sensors 118 are coupled to the signal processor 158. In particular, the vibration sensors 118 provide sensor signals to the signal processor 158. The signal processor 158 receives the sensor signals and performs simple signal processing and analysis on the sensor signals. The signal processor 158 generates output data 160 based on the signal analysis and processing. The output data 160 may correspond to sensor data.

The signal processor 158 may initially receive voltage based sensor signals such as those shown in FIG. 4B. The signal processor 158 may then perform signal processing techniques on the sensor signals. The signal processor 158 may filter out background noise from the sensor signals. The signal processor may perform frequency distribution analysis of the sensor signals. The signal processor 158 may perform amplitude analysis on the sensor signals. The signal processor 158 may perform phase deviation analysis. The signal processor 158 may perform velocity analysis on the sensor signals. The signal processor 158 may perform superposition analysis on the sensor signals, for example by superimposing the sensor signals from two or more of the vibration sensors and then performing signal analysis on the superimposed sensor signals. The signal processor 158 may perform deconvolution analysis on the sensor signals. The signal processor 158 outputs output data 160. The output data 160 can include various types of analysis data described above related to the sensor signals. The analysis data 160 can include other types of analysis data without departing from the scope of the present disclosure.

In some embodiments, the signal processor 158, or another part of the control system 116 may receive and retain environmental information. The environmental information may be termed EUV light generation parameter data, or may be a subset of EUV light generation parameter data. The environmental information can include information related to the materials of the droplets 128, the collector 114, and the enclosure 124. The material information can include elemental composition, mass, density, thickness, speed of sound, natural resonance frequencies, melting points, boiling points, electron configuration, allotropes, ionization energies, van der Waals radii, crystal structures, Young's modulus, shear modulus, bulk modulus, and other information related to the various materials that make up the collector 114, the enclosure 124 in the droplets 128.

The environmental information may include information related to the laser 112. The laser information can include pulse duration, pulse to pulse position separation, pulse to pulse delay time, beam stability, beam energy, beam phase, beam profile, beam caustic, EUV energy, wavefront information, and other information associated with the laser 112. This information may include laser to droplet position associated with a flattening pulse and laser to flattened droplet position associated with the flattened droplet 128. Some of the laser information may be determined by a machine learning process based on other parameters as will be set forth in more detail below.

The environmental information can include information related to the droplets 128. This information can include droplet speed, droplet size, droplet frequency, droplet temperature, droplet material, and other information related to the droplets 128.

The environmental information can include thermal information. The thermal information can include the temperature within the EUV light generation chamber 104, the temperature of a heater associated with the EUV light generation chamber 104, collector surface temperature, air temperature, flow inlets temperature, substrate temperature, heat of fusion, heat of vaporization, molar heat capacity, thermal conductivity, thermal expansion etc. Though not illustrated in the Figures, the EUV light generation chamber 114 may include various fluid inlets, director vanes, mass flow controllers, and other mechanisms for selectively flowing fluids into the EUV light generation chamber 104.

The environmental information can include flow information. The flow information can include center cone flow information, umbrella cone flow information, perimeter flow information, shower flow information, they flow information, mass flow control limits information, mass flow control resolution, flow backing pressure, or other types of information related to the flow of fluids into and out of the EUV light generation chamber 104. The environmental information can also include pressure information such as vacuum pressure information, chamber pressure, vapor pressure, or other information related to pressure within the EUV light generation chamber 104.

The various types of environmental information may be stored in or provided to the signal processor 158 to assist in signal processing. The signal processor 158 can take into account the various types of environmental information when analyzing or processing the sensor signals received from the vibration sensors 118.

Figure 6:
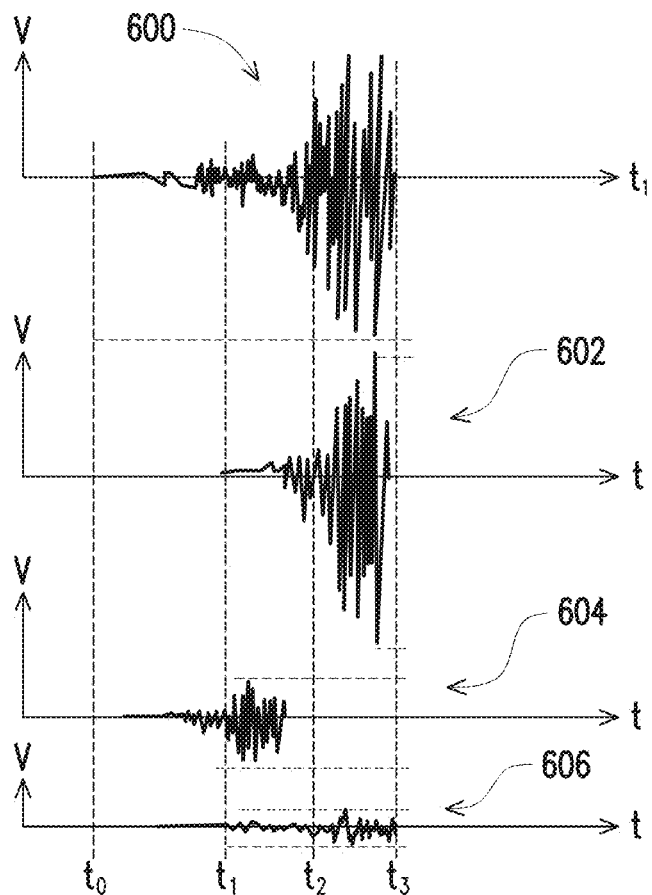
FIG. 6 includes a plurality of graphs sensor signals from one or more vibration sensors, in accordance with some embodiments.

FIG. 6 includes a plurality of graphs of sensor signals from one or more vibration sensors 118, in accordance with some embodiments. The description of FIG. 6 is made with reference to the components, processes, and systems described in relation to FIGS. 1-5. The graph 600 is a raw sensor signal from a vibration sensor 118 during a plasma generation process. At time t0 the flattening laser pulse from the laser 112 impacts the droplet 128. At time t1 the plasmatizing pulse from the laser 112 impacts the flattened droplet 128. At and around time t2 the plasma evolution of the plasmatized droplet 128 occurs. Additionally, around time t2 droplet debris 150 is scattered from the plasmatized droplet. At time t3, the interaction has ended. As will be set forth in more detail below, the graphs 602, 604, and 606 illustrate the components of the raw sensor signal that correspond to each of the events.

The graph 604 illustrates the component of the raw sensor signal from a vibration sensor 118 that is based on the flattening laser pulse of the laser 112 impacting the droplet 128. There is some delay between the flattening pulse at time t0 and the sensing of the flattening pulse. The graph 604 illustrates that shortly after the flattening pulse impact at time t0, the vibration sensors 118 detect some vibration associated with the shockwave from the flattening pulse. The vibrations from the flattening pulse persist in the signal until just before time t2.

The graph 602 illustrates the component of the raw sensor signal from a vibration sensor 118 that is based on the plasmatizing pulse of the laser 112 impacting the droplet 128 at time t1. The shockwave from the plasmatizing pulse is pronounced in the signal 602 until about time t3. The vibrations from the shockwave from the plasmatizing pulse have the largest amplitude among the components of the raw signal.

The graph 606 illustrates the component of the raw sensor signal from a vibration sensor 118 that is based on particle debris 150 hitting the interior surface 131 of the collector or 135 enclosure 124, as the case may be. Some debris results from the impact of the flattening pulse. Most of the debris results from the plasmatizing pulse. The signals of the graphs 602, 604, and 606 may be extracted from the raw sensor signal of the graph 600 by the signal analyzer 658. The various signals and signal components can have other forms than those shown in FIG. 6 without departing from the scope of the present disclosure.

Figures 7, 8:
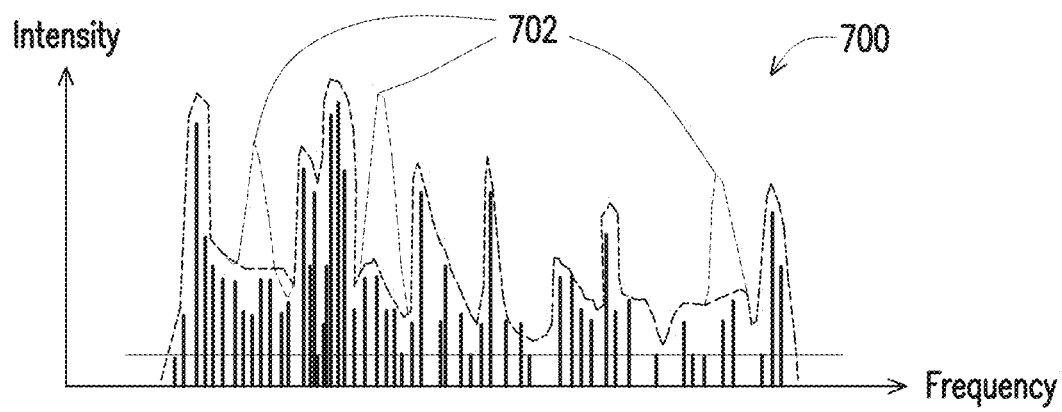
FIG. 7 is a graph of sensor signal intensity in the frequency domain, in accordance with some embodiments.
FIG. 8 is an illustration of a collector, in accordance with some embodiments.

FIG. 7 is a graph 700 of sensor signal intensity in the frequency domain, in accordance with some embodiments. The graph 700 represents a Fourier transform of the raw sensor signal of the graph 600 of FIG. 6. Accordingly, the graph 700 represents the frequency domain representation of a signal from a vibration sensor 118 as a result of impacts from the laser 112 on droplets 128 and from droplet debris 150 impacting the collector 114. The graph 700 can include signals generated from sensor signals of a vibration sensor 118 in accordance with the components, systems, and processes described in relation to FIGS. 1-6. The signal processor 158 can perform a Fourier transform on the time domain signal of the graph 600 in order to generate a frequency domain signal of the graph 700.

A Fourier transform helps to distinguish frequency distribution. The frequency distribution may include true signal-to-noise and abnormal frequency peaks 702 which may be induced from system instability. The noise can be recognized and filtered out by machine learning. The abnormal peaks 702 can be used to diagnose system problems by comparing with data from a large database. The abnormal peaks may be caused by environmental vibrations, natural frequency from hardware components, or other factors. Accordingly, transforming time domain sensor signals from the vibration sensors 118 into the frequency domain signals can be very beneficial in diagnosing system issues as described above.

In the long-term, time domain signals and frequency domain signals can be collected and stored. The various time domain signals and frequency domain signals can be labeled in accordance with the quality of EUV light generation associated with them. As will be set forth in more detail below, this data can be utilized in a machine learning process that can assist in determining root causes and in correcting abnormal conditions to improve laser plasma conditions.

FIG. 8 is an illustration of a collector 114, in accordance with some embodiments. FIG. 8 and in the description of FIG. 8 may be particularly relevant to step 310 of a method 300 of FIG. 3, though the principles illustrated in relation to FIG. 8 may be implemented in other systems, components, and processes without departing from the scope of the present disclosure. In the view of FIG. 8, the collector 114 is shown in a different orientation than in FIGS. 2A and 2B. This is done only for illustrative purposes. In practice, the collector 114 of FIG. 8 may have the same orientation as in FIGS. 2A and 2B.

FIG. 8 illustrates a calibration process that can assist in determining plasma evolution characteristics of a droplet 128. FIG. 8 illustrates a known point 162 above the collector 114. The known point 162 will have a particular set of location coordinates (x, y, z) in a coordinate system. FIG. 8 also illustrates a primary focus 164 associated with the collector 114. As set forth previously, the collector 114 may be a parabolic or elliptical mirror with a primary focus. The primary focus 164 corresponds to the primary focus of the collector 114. FIG. 8 also illustrates the locations of three vibration sensors 118. The locations of the vibration sensors 118 are shown on the interior surface 131 of the collector 114. However, in practice, the vibration sensors are located in the corresponding locations on the exterior surface 135 of the collector 114.

A collision test or calibration process can be performed for the vibration sensors 118 and the collector 114. First, a first known mass is launched toward the collector 114 with velocity V from the known point 162. The first mass impacts the interior surface 131 of the collector 114. Vibration waves propagate from the impact location to the various vibration sensors 118. The vibration reaches each of the vibration sensors 118 after respective time periods.

Next, a second known mass is launched toward the collector 114 with velocity V from the primary focus 164. The second mass impacts the interior surface 131 of the collector 114. Vibration waves propagate from the impact location to the various vibration sensors 118. The vibrations reach each of the vibration sensors 118 after respective time periods.

The signal differences between the sensor signals of the various vibration sensors resulting from impacts by the first and second masses can be utilized to calibrate the vibration sensors 118 at defined positions in space. In one example, a calibration matrix or parameters space can be built by launching masses from various locations. The masses can be varied, the velocity can be varied, release positions can be varied, and target impact positions can be varied. The vibration sensor signals can be recorded for each impact. The calibration matrix can include the various masses and velocities in a parameter space. A reference data table can include the differences in launching target positions.

The characteristics of the sensor signals in accordance with these calibration data can be used as reference data to benchmark the slip distance between plasma position and primary focus for real time mother system set up. Accordingly, the control system 116 can utilize the calibration data in order to determine the characteristics of plasma evolution.

System resolution improves with higher numbers of vibration sensors. While FIG. 8 illustrates three vibration sensors 118, in practice, many more than three vibration sensors 118 may be utilized as shown in relation to FIGS. 2A-2D.

With continued reference to FIG. 8, another method can be utilized to determine the position of debris on the collector 114. In this example, rather than launching particles from a known point 162, particles can be launched toward the collector from a plurality of unknown or unrecorded positions. Every small piece of droplet debris can be conceptualized as a point source when the debris hits the interior surface 131 of the collector 114, the debris becomes a point vibration source. The vibration wave propagates through the collector 114 and reaches the various vibration sensors 118 at different respective times based on their respective distances from the impact location. Depending on the time differences in vibration signals reaching the various vibration sensors 118 from an impact, the location of the impact can be deduced. For example, the shorter the elapsed time for a vibration signal to reach a particular vibration sensor 118, the closer the impact location is to that vibration sensor. With three or more vibration sensors 118 of known location, the exact impact location can be deduced based on the different elapsed times for the vibration signals to reach the vibration sensors 118. The plasma position in space can also be computed by determining the impact position and impact time with consideration to the time difference between firing the flattening pulse and firing the plasmatizing pulse. Because the speed of light is constant for both laser pulses, the time difference between firing the laser pulses can be converted to a travel distance of the droplet 128 because the velocity of the droplet 128 is known. Thus, this process can be utilized to determine the plasma position.

Figure 9:
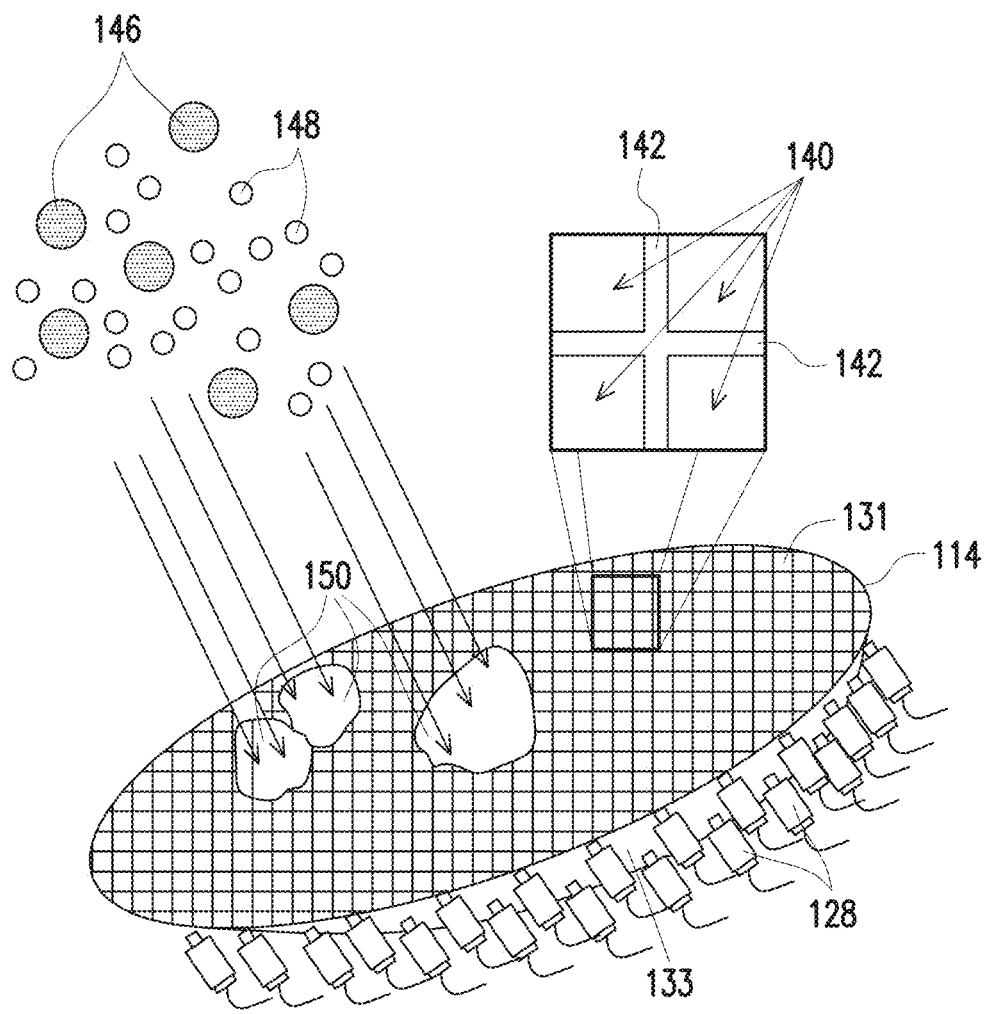
FIG. 9 is an illustration of a collector, in accordance with some embodiments.

FIG. 9 is an illustration of a collector 114, in accordance with some embodiments. FIG. 9 and the corresponding description may be particularly relevant to step 310 of a method 300 of FIG. 3, the principles of FIG. 9 can be implemented in accordance with other components, systems, and processes without departing from the scope of the present disclosure. The collector 114 of FIG. 9 may correspond to the collector 114 of FIG. 2D. In particular, the collector 114 may be made of mirror units 140 separated from each other by contraction joints 142. The mirror units 140 are laid out in a grid as shown in FIG. 2D.

FIG. 9 illustrates the droplet particles 146 and free electrons 148 that have been ejected or scattered from a plasmatized droplet 128. The droplet particles 146 correspond to debris that deposits on the interior surface 131 of the collector 114. Because there is a vibration sensor 118 for each mirror unit 140, the location of each debris deposit can be determined based on sensed vibrations. For smaller sizes of mirror units 140 and correspondingly larger numbers of vibration sensors 118, the resolution of debris location detection can be improved. The principles of FIG. 9 can be utilized to determine the orientation of the bottom surface of the flattened droplet 128 because debris scattering happens in accordance with the orientation of the bottom surface of the flattened droplet 128.

The contraction joints 142 can be utilized to insert flow inlets. The fluid inlets can enable cleaning or purging fluids to flow onto the locations of debris 150. The fluid inlets can be selectively controlled so that purging fluid flow is directed only toward those locations at which debris buildup has occurred.

Figure 10A:
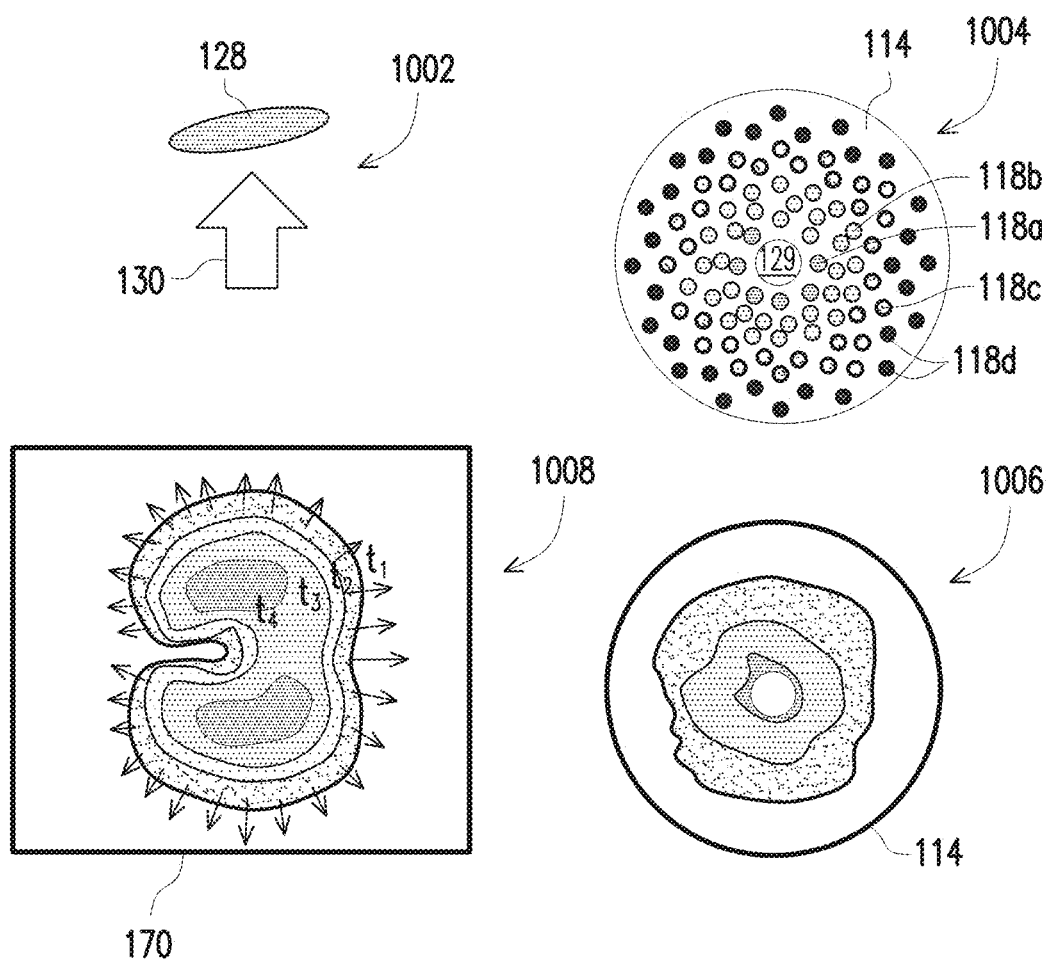
FIG. 10A illustrates a process for constructing a two dimensional representation of plasma evolution, in accordance with some embodiments.

FIG. 10A illustrates a process for constructing a two dimensional representation of plasma evolution, in accordance with some embodiments. FIG. 10A and a corresponding description may be of particular relevance to step 310 of the method 300 of FIG. 3, though the principles illustrated in FIG. 10A can be utilized in conjunction with other components, systems, and processes without departing from the scope of the present disclosure.

At 1002, a plasmatizing laser pulse 130 impacts the bottom of a flattened droplet 128. Accordingly, the flattened droplet 128 has already been impacted by the flattening pulse. In the example of FIG. 1000, the plasmatizing pulse 130 has good alignment with the flattened droplet 128. Good alignment corresponds to a plasmatizing pulse 130 being centered on the center of the bottom surface of the flattened droplet 128.

At 1004, the vibration sensors coupled to a collector 114 sense vibrations from the flattening pulse, the plasmatizing pulse, and the impact of debris from the droplet 128. Step 1004 illustrates a top view of a collector 114. Vibration sensors 118 are divided into groups 118a, 118b, 118c, and 118d based on the strength of the vibrations sensed by the vibration sensors. In the example of FIG. 10A, vibration sensors 118a are near the center of the collector 114 sense vibrations the most strongly. Vibration sensors 118b are somewhat further away from the center than vibration sensors 118a sense moderately strong vibrations, though not as strong as the sensors 118a. Vibration sensors 118c are somewhat further away from the center than vibration sensors 118b sense week vibrations. Vibration sensors 118d are somewhat further away from the center than vibration sensors 118c and sense little or no vibration. This pattern indicates that debris scattering and the laser pulse shockwaves are centered closely around opening 129.

At 1006, a spatial density distribution of vibrations is reconstructed on the interior surface 131 of the collector 114. The spatial density distribution indicates the distribution of vibration strength on the surface of the collector based on the sensor signals received from the groups of vibration sensors 118a-d in step 1004.

At 1008, a 2D plasma evolution model 170 is reconstructed based on the spatial density of neutrals at plasma position. More particularly, the plasma evolution is generated based on the reconstruction of the spatial density distribution on the collector surface as shown at step 1006. The plasma evolution reconstruction indicates areas of dense plasma and areas of sparse plasma in a plasmatized droplet 128.

Figure 10B:
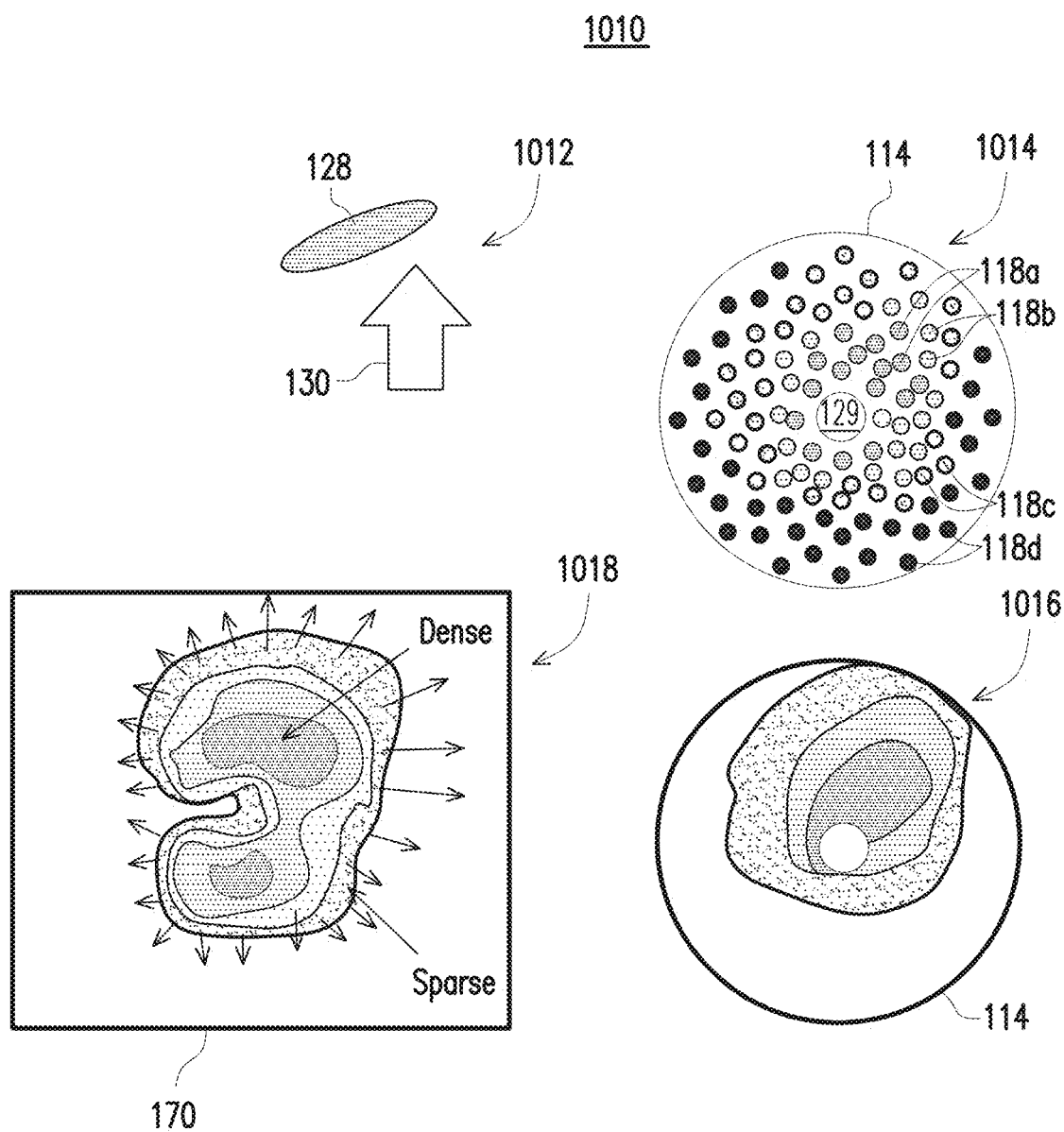
FIG. 10B illustrates a process for constructing a two dimensional representation of plasma evolution, in accordance with some embodiments.

FIG. 10B illustrates a process 1010 for constructing a two dimensional representation of plasma evolution, in accordance with some embodiments. The process 1010 of FIG. 10B is the same as the process 1000 of FIG. 10A. The only difference is that in FIG. 10B the initial alignment of the plasmatizing laser pulse 130 with the flattened droplet 128 is poor, whereas the alignment was good in FIG. 10A. Different reference numbers for the process and steps are used in FIG. 10B only to avoid confusion.

At 1012, a plasmatizing laser pulse 130 impacts the bottom of a flattened droplet 128. Accordingly, the flattened droplet 128 has already been impacted by the flattening pulse. In the example of FIG. 10B, the plasmatizing pulse 130 has poor alignment with the flattened droplet 128. In FIG. 10B a plasmatizing pulse 130 impacts a front edge of the bottom surface of the flattened droplet 128, rather than in the center of the bottom surface of the flattened droplet 128.

At 1014, the vibration sensors coupled to a collector 114 sense vibrations from the flattening pulse, the plasmatizing pulse, and the impact of debris from the droplet 128. Step 1014 illustrates a top view of a collector 114. Vibration sensors 118 are divided into groups 118a, 118b, 118c, and 118d based on the strength of the vibrations sensed by those vibration sensors. The vibration sensors 118a sense vibrations more strongly than the vibration sensors 118b. The vibration sensors 118b sense vibrations more strongly than the vibration sensors 118c. The vibration sensors 118c sense vibrations more strongly than the vibration sensors 118d. The difference between FIG. 10A and FIG. 10B is that the vibration sensors 118a that sense vibration strongly are not so neatly centered around the aperture 129 in FIG. 10B as they were in FIG. 10A. In the example of FIG. 10B, vibration sensors 118a near the center of the collector 114 sense vibrations the most strongly.

At 1016, a spatial density distribution of vibrations is reconstructed on the interior surface 131 of the collector 114. The spatial density distribution indicates the distribution of vibration strength on the surface of the collector based on the sensor signals received from the groups of vibration sensors 118a-d in step 1014.

At 1018, a 2D plasma evolution model 170 is reconstructed based on the spatial density of neutrals at plasma position. More particularly, the plasma evolution is generated based on the reconstruction of the spatial density distribution on the collector surface as shown at step 1016. The plasma evolution reconstruction indicates areas of dense plasma and areas of sparse plasma in a plasmatized droplet 128. The plasma evolution reconstruction indicates the shape and density of the plasma at times t1, t2, t3, and t4.

Figure 10C:
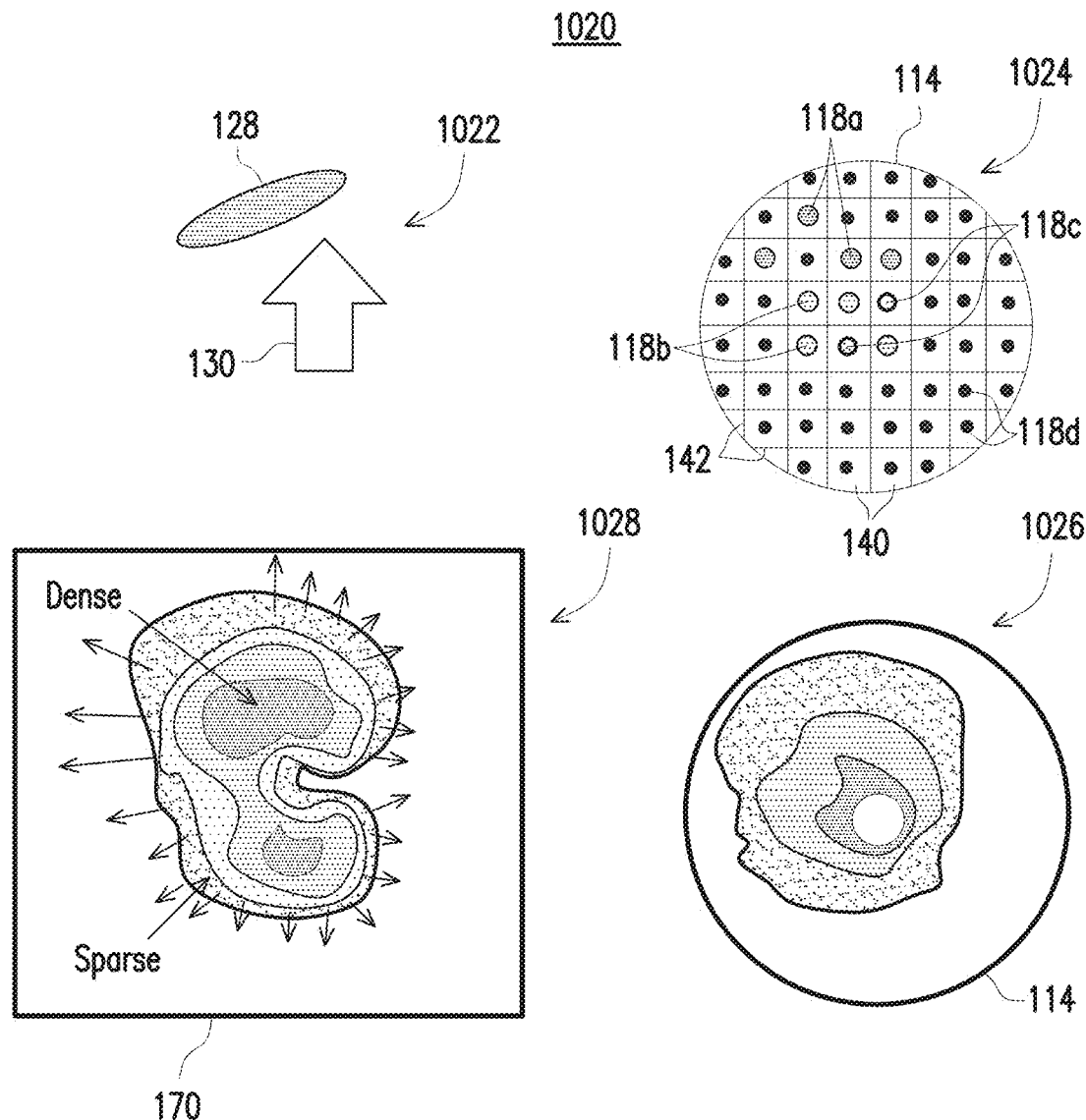
FIG. 10C illustrates a process for constructing a two dimensional representation of plasma evolution, in accordance with some embodiments.

FIG. 10C illustrates a process 1020 for constructing a two dimensional representation of plasma evolution, in accordance with some embodiments. The process 1020 of FIG. 10B is the same as the process 1010 of FIG. 10B. The only difference is that in FIG. 10C the collector 114 includes the separate mirror units 140 and constriction joints 142 in accordance with FIGS. 2D and 9. Different reference numbers for the process and steps are used in FIG. 10C only to avoid confusion.

At 1022, a plasmatizing laser pulse 130 impacts the bottom of a flattened droplet 128. Accordingly, the flattened droplet 128 has already been impacted by the flattening pulse. In the example of FIG. 10C, the plasmatizing pulse 130 has poor alignment with the flattened droplet 128. In FIG. 10C a plasmatizing pulse 130 is centered on a front edge of the bottom surface of the flattened droplet 128, rather than on the center of the bottom surface of the flattened droplet 128.

At 1024, the vibration sensors coupled to a collector 114 sense vibrations from the flattening pulse, the plasmatizing pulse, and the impact of debris from the droplet 128. Step 1024 illustrates a top view of a collector 114. Vibration sensors 118 are divided into groups 118a, 118b, 118c, and 118d based on the strength of the vibrations sensed by those vibration sensors. The vibration sensors 118a sense vibrations more strongly than the vibration sensors 118b. The vibration sensors 118b sense vibrations more strongly than the vibration sensors 118c. The vibration sensors 118c sense vibrations more strongly than the vibration sensors 118d.

At 1026, a spatial density distribution of vibrations is reconstructed on the interior surface 131 of the collector 114. The spatial density distribution indicates the distribution of vibration strength on the surface of the collector based on the sensor signals received from the groups of vibration sensors 118a-d in step 1024.

At 1028, a 2D plasma evolution model 170 is reconstructed based on the spatial density of neutrals at plasma position. More particularly, the plasma evolution is generated based on the reconstruction of the spatial density distribution on the collector surface as shown at step 1026. The plasma evolution reconstruction indicates areas of dense plasma and areas of sparse plasma in a plasmatized droplet 128. The plasma evolution reconstruction indicates the shape and density of the plasma at times t1, t2, t3, and t4.

Figure 11:
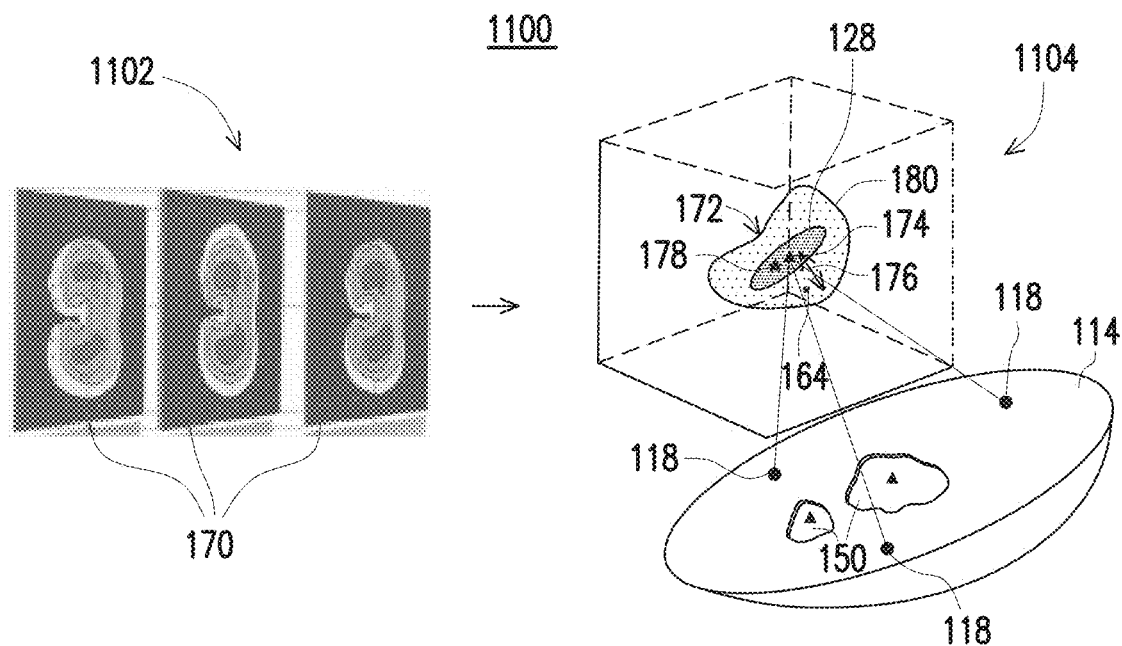
FIG. 11 illustrates a process for generating a 3D holographic and time resolved plasma model, in accordance with some embodiments.

FIG. 11 illustrates a process 1100 for generating a 3D holographic and time resolved plasma model, in accordance with some embodiments. FIG. 11 and the corresponding description may be of particular relevance to step 312 of a method 300 of FIG. 3, though the principles of FIG. 11 may be utilized in accordance with other processes, systems, and components without departing from the scope of the present disclosure.

At 1102, a plurality of plasma evolution models 170 are generated. Each of the plasma evolution models 170 can be generated in accordance with the processes described in relation to FIGS. 10A-10C. Each plasma evolution model 170 can be generated for a different period of time utilizing the principles described in relation to FIGS. 10A-10C.

At 1104, a plurality of plasma evolution models 170 are combined into a 3D plasma model 172. The 3D plasma model 172 is 3D in the sense that includes two spatial axes and one time axis. The two spatial axes correspond to the axes of the 2D plasma evolution models 170. The time axis is generated because each 2D plasma model 170 represents a distinct moment in time.

The 3D plasma model 172 indicates the plasma center 174, the primary focus 164, the shift distance 176 of the plasma from the primary focus 164, the plasmatizing pulse position 178, and the plasma edge 180. The various locations can be given in Euclidean coordinates and with a time component. For example, the plasma center 174 may be given for time t1 early in the plasma evolution. The plasma edge 180 may be given for time t2 later in a plasma evolution. The position of debris 150 may also be included for time t3 much later than the time t2. Various other processes can be utilized to generate a 3D holographic and time resolved plasma model without departing from the scope of the present disclosure.

FIGS. 12A-H are illustrations of 3D plasma models and corresponding flattening and plasmatizing pulses, in accordance with some embodiments. FIGS. 12A-12H illustrate diagnostics associated with the 3D plasma models and associated parameters. FIGS. 12A-H may be relevant to step 314 of the method 300 of FIG. 3, though principles associated with FIGS. 12A-H may be utilized in conjunction with other systems, processes and components without departing from the scope of the present disclosure.

Figure 12A:
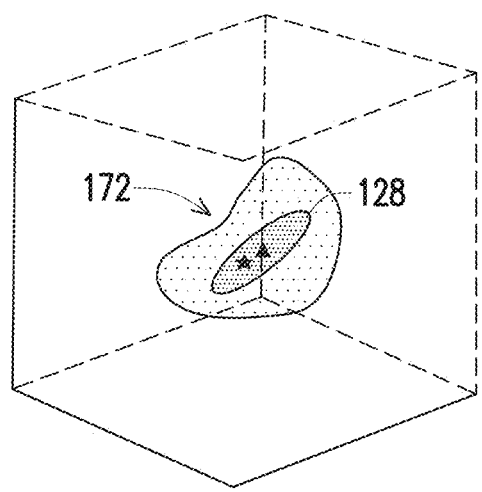
FIGS. 12A-12H are illustrations of 3D plasma models and corresponding flattening and plasmatizing pulses, in accordance with some embodiments.
Figure 12A:
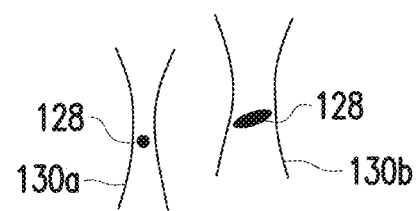

FIG. 12A illustrates a 3D plasma model 172 associated with generating EUV light from a droplet 128. FIG. 12A also illustrates the flattening laser pulse 130a and a plasmatizing laser pulse 130b utilized to flatten and plasmatize the droplet 128. The 3D plasma model 172 represents good laser targeting and plasma generation. The flattening pulse 130a is centered on the droplet 128. The plasmatizing pulse 130b is centered on an impacts the entirety of the flattened droplet 128. None of the flattened droplet 128 is protruding outside the plasmatizing pulse 130b. Furthermore, the flattened droplet has an only relatively small tilt relative to horizontal. All of these parameters result in good plasma formation, good EUV light generation, and low debris scattering.

Figure 12B:
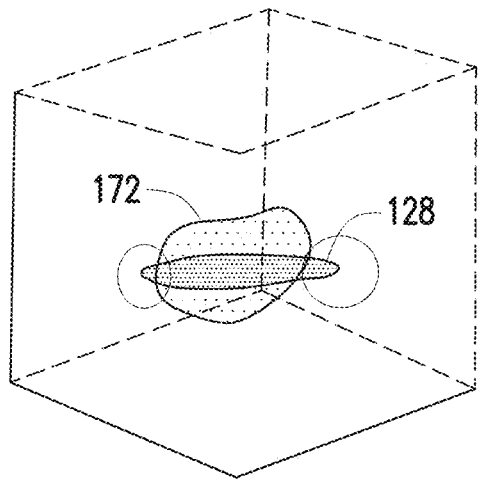
Figure 12B:
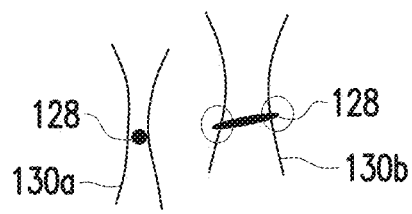

FIG. 12B illustrates a 3D plasma model 172 associated with generating EUV light from a droplet 128. FIG. 12B also illustrates the flattening laser pulse 130a and a plasmatizing laser pulse 130b utilized to flatten and plasmatize the droplet 128. The 3D plasma model 172 represents undesirable laser targeting and plasma generation. The flattened droplet 128 is too large. The plasmatizing pulse 130b cannot impact the entirety of the flattened droplet 128. Portions of the flattened droplet 128 are protruding from the plasmatizing pulse 130b. The portions of the droplet 128 that are not plasmatized result in larger amounts of debris on the collector 114 and the enclosure 124. The portions of the flattened droplet 128 that are not impacted by the plasmatizing pulse 130b are not plasmatized.

Figure 12C:
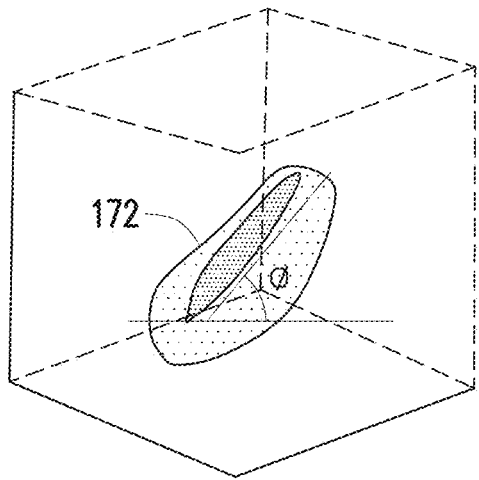
Figure 12C:
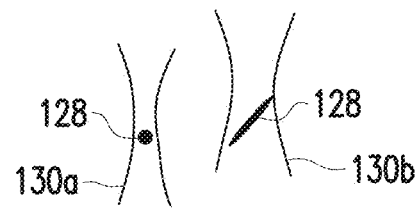

FIG. 12C illustrates a 3D plasma model 172 associated with generating EUV light from a droplet 128. FIG. 12C also illustrates the flattening laser pulse 130a and a plasmatizing laser pulse 130b utilized to flatten and plasmatize the droplet 128. The 3D plasma model 172 represents undesirable laser targeting and plasma generation. The flattened droplet 128 is tilted at a very large angle relative to horizontal. The larger the angle, the smaller the contact area with the plasmatizing pulse 130b. This results in larger amounts of debris.

Figure 12D:
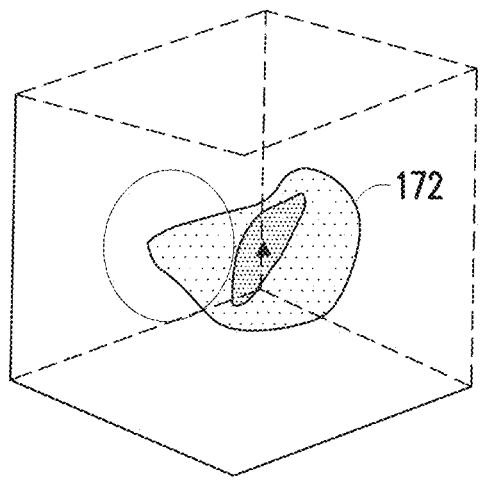
Figure 12D:
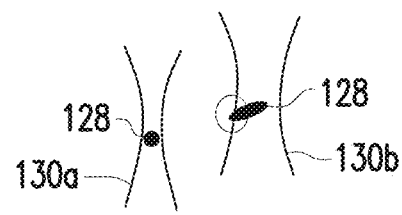

FIG. 12D illustrates a 3D plasma model 172 associated with generating EUV light from a droplet 128. FIG. 12D also illustrates the flattening laser pulse 130a and the plasmatizing laser pulse 130b utilized to flatten and plasmatize the droplet 128. The 3D plasma model 172 represents undesirable laser targeting and plasma generation. The plasmatizing pulse 130b is not centered on the flattened droplet 128. This results in poor plasma evolution and increased amounts of debris and contamination.

Figure 12E:
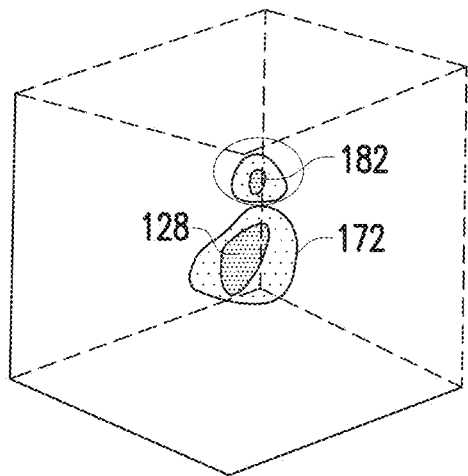
Figure 12E:
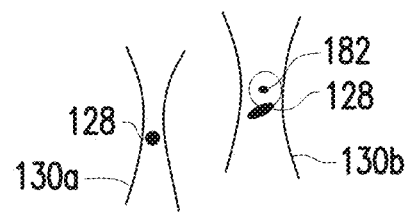

FIG. 12E illustrates a 3D plasma model 172 associated with generating EUV light from a droplet 128. FIG. 12E also illustrates the flattening laser pulse 130a and the plasmatizing laser pulse 130b utilized to flatten and plasmatize the droplet 128. The 3D plasma model 172 represents undesirable laser targeting and plasma generation. A piece of debris 182 has broken off from the droplet 128. This may induce unintended generation of EUV light in addition to increased amounts of debris.

Figure 12F:
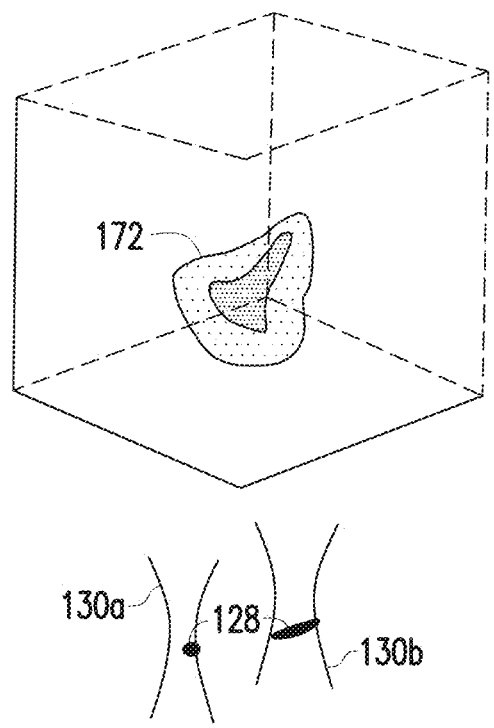
Figure 12G:
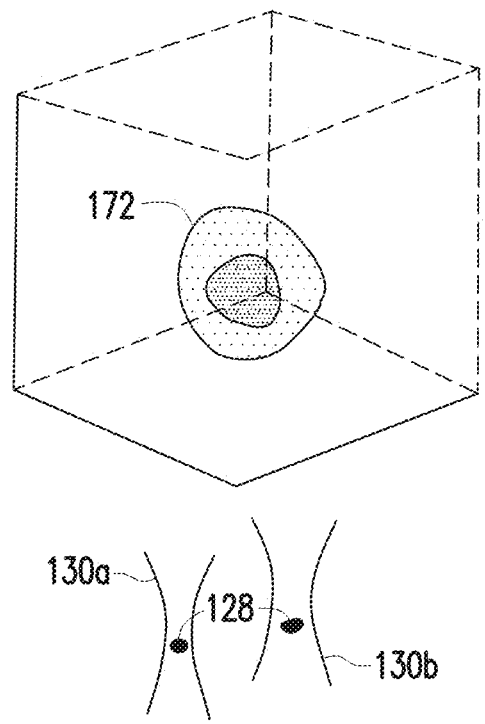

FIG. 12F illustrates a 3D plasma model 172 associated with generating EUV light from a droplet 128. FIG. 12G also illustrates the flattening laser pulse 130a and the plasmatizing laser pulse 130b utilized to flatten and plasmatize the droplet 128. The 3D plasma model 172 represents undesirable laser targeting and plasma generation. The flattening pulse 130a is not centered on the droplet 128. This results in poor plasma evolution and increased amounts of debris and contamination.

FIG. 12G illustrates a 3D plasma model 172 associated with generating EUV light from a droplet 128. FIG. 12G also illustrates the flattening laser pulse 130a and the plasmatizing laser pulse 130b utilized to flatten and plasmatize the droplet 128. The 3D plasma model 172 represents undesirable laser targeting and plasma generation. The flattening pulse 130a does not sufficient energy to flatten the droplet 128. When the plasmatizing pulse 130b impacts the droplet 128, the droplet 128 is not fully plasmatized. This results in poor plasma evolution and increased amounts of debris and contamination.

Figure 12H:
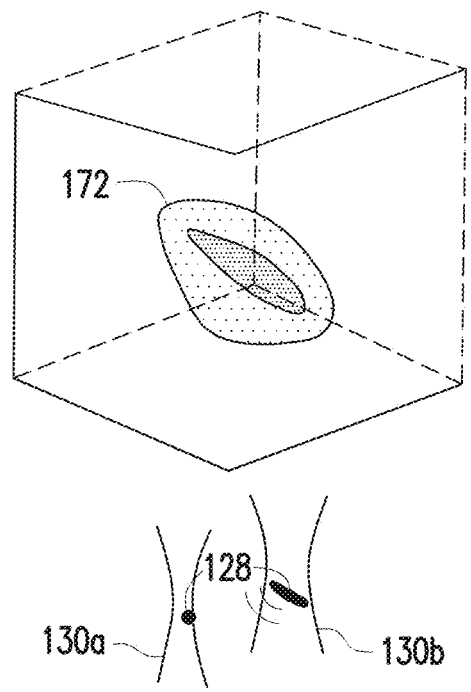

FIG. 12H illustrates a 3D plasma model 172 associated with generating EUV light from a droplet 128. FIG. 12H also illustrates the flattening laser pulse 130a and the plasmatizing laser pulse 130b utilized to flatten and plasmatize the droplet 128. The 3D plasma model 172 represents undesirable laser targeting and plasma generation. The flattening pulse 130a is not properly centered on the droplet 128. This results in tilting of the flattened droplet 128 in an undesirable direction. The angles tilting results in a shockwave heading partially in the direction of oncoming droplets 128. This will make the oncoming droplets unstable and EUV light generation would also be unstable. This results in poor plasma evolution and increased amounts of debris and contamination.

Figure 12I:
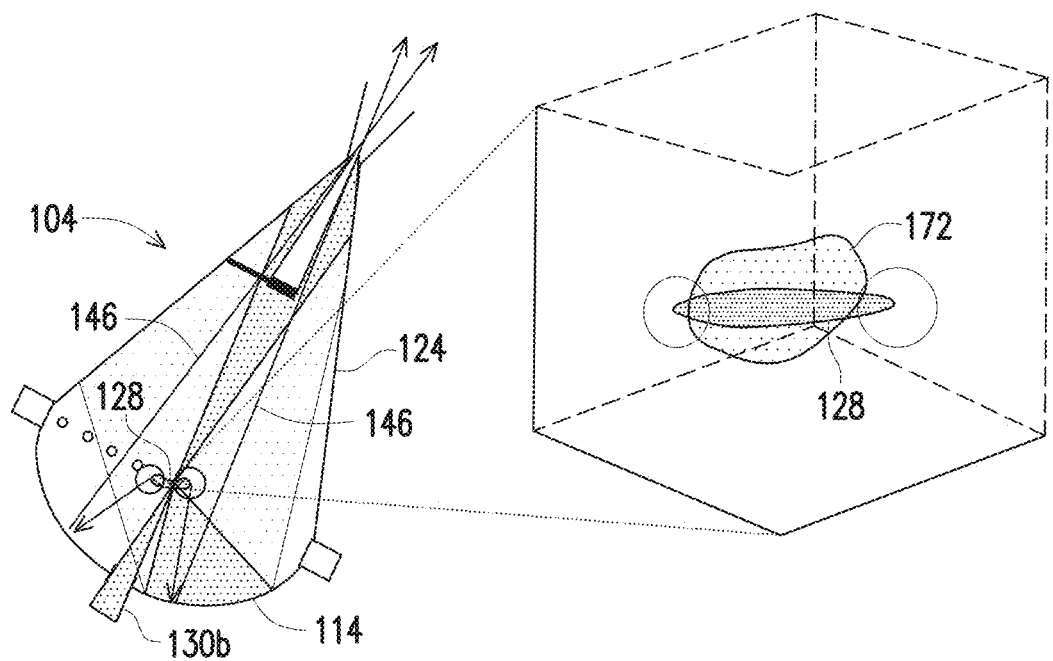
FIG. 12I illustrates an EUV light generation chamber and a 3D model of a droplet impacted by a plasmatizing pulse, in accordance with some embodiments.

FIG. 12I illustrates an EUV light generation chamber 104 and a 3D model of a droplet 128 impacted by a plasmatizing pulse 130b. In the example of FIG. 12I, the flattened droplet 128 is too large. Portions of the flattened droplet 128 protrude outside of the plasmatizing pulse 130b. The result is debris 146 breaks off of the non-plasmatized portions of the droplet 128 reflects off the collector 114 and travels out of the EUV light generation chamber toward the scanner 108 (see FIG. 1). This can be highly problematic if any of the debris 146 impacts the reticle within the scanner 108. If debris 146 impacts the reticle, the photolithography processes may be ruined. Furthermore, the reticle may need to undergo a time-consuming and highly expensive cleaning process to remove the debris 146 from the reticle.

Figure 12J:
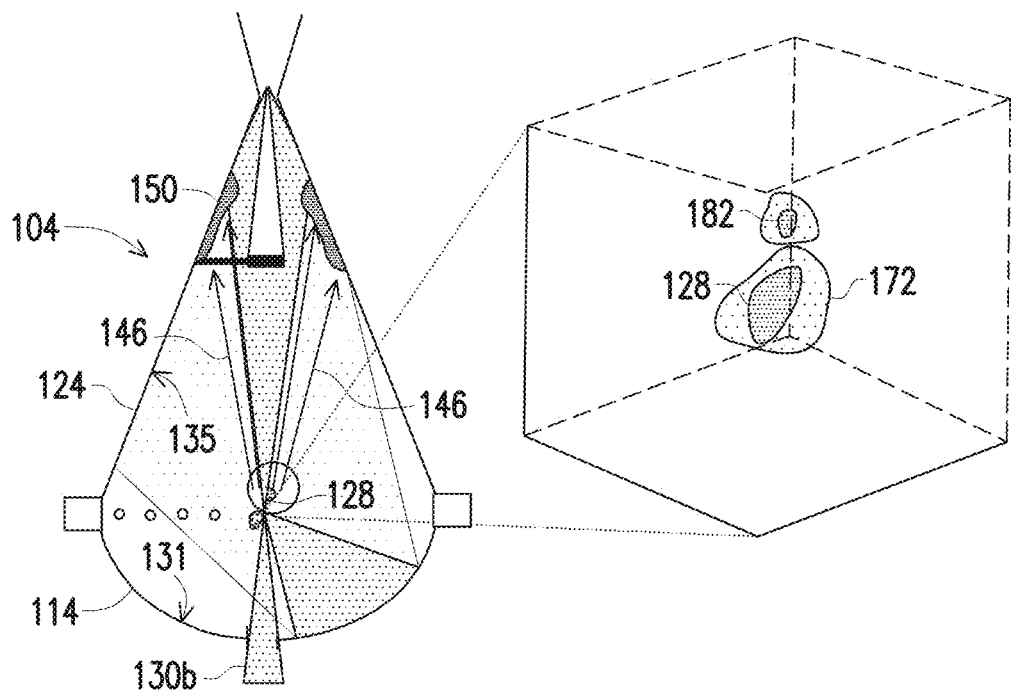
FIG. 12J illustrates an EUV light generation chamber and a 3D model of a droplet impacted by a plasmatizing pulse, in accordance with some embodiments.

FIG. 12J illustrates an EUV light generation chamber 104 and a 3D model of a droplet 128 impacted by a plasmatizing pulse 130b. In the example of FIG. 12I, a satellite 182 has broken off of the droplet 128. The result is that debris 146 scatters from the droplet 128. The debris 146 forms debris deposits 150 on the interior surface 135 of the enclosure 124. This may also result in debris deposits 150 on the interior surface 131 of the collector 114, thereby degrading the collector 114.

Figure 12K:
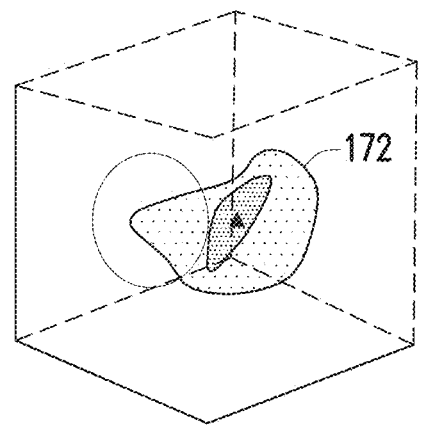
FIG. 12K illustrates a 3D plasma model associated with generating EUV light from a droplet, in accordance with some embodiments.
Figure 12K:
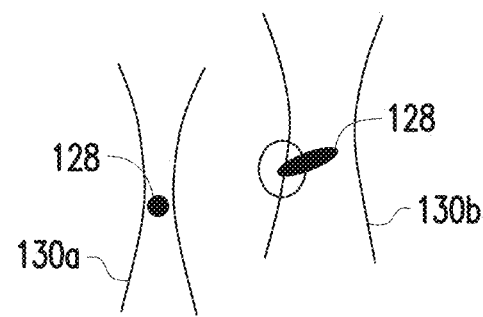

FIG. 12K illustrates a 3D plasma model 172 associated with generating EUV light from a droplet 128. FIG. 12D also illustrates the flattening laser pulse 130a and the plasmatizing laser pulse 130b utilized to flatten and plasmatize the droplet 128. FIG. 12K in the corresponding description may be of particular relevance to steps 314 and 316 of the method 300 of FIG. 3. The 3D plasma model 172 represents undesirable laser targeting and plasma generation. The plasmatizing pulse 130b is not centered on the flattened droplet 128. This results in poor plasma evolution and increased amounts of debris and contamination.

After the vibration sensors 118 have sensed the vibrations, the sensor data and other parameters associated with the generation of plasma are passed to an analysis model of the control system 116. The analysis model has been trained with a machine learning process to identify parameters that can be adjusted to improve the quality of plasma generation and EUV light generation. The analysis model analyzes the various data and generates parameter adjustment data indicating recommended parameter adjustments to improve plasma and EUV light generation. In the example of FIG. 12K, the parameter adjustment data indicates that the flattening pulse should be adjusted to increase the energy of the flattening pulse. This can include a specific energy increase, for example by 3 mJ or another value.

Figure 12L:
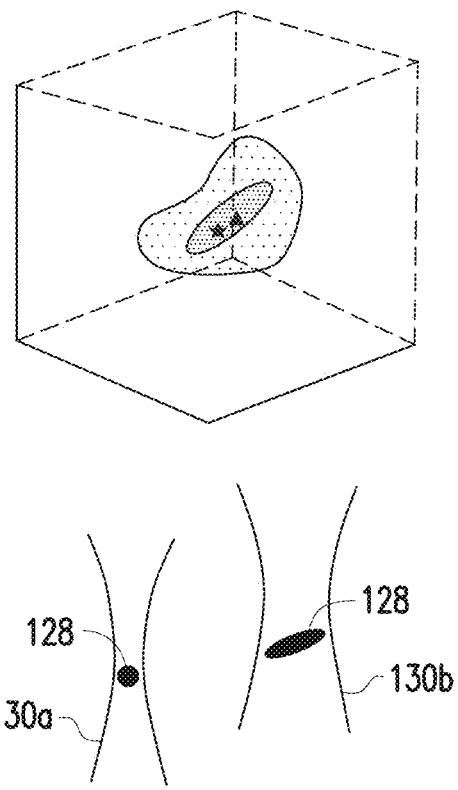
FIG. 12L illustrates a 3D plasma model associated with generating EUV light from a droplet, in accordance with some embodiments.

FIG. 12L illustrates a 3D plasma model 172 associated with generating EUV light from a droplet 128 after the recommended parameter adjustments have been made from FIG. 12K. FIG. 12L also illustrates the flattening laser pulse 130a and the plasmatizing laser pulse 130b utilized to flatten and plasmatize the droplet 128. In FIG. 12 L, the flattening pulse 138 is centered on the droplet 128 and has sufficient energy to flatten the droplet 128. The plasmatizing pulse 130b is also centered on the droplet 128. The droplet 128 has a low degree of tilt relative to horizontal. The result is high-quality plasma evolution and EUV light generation.

Figure 13:
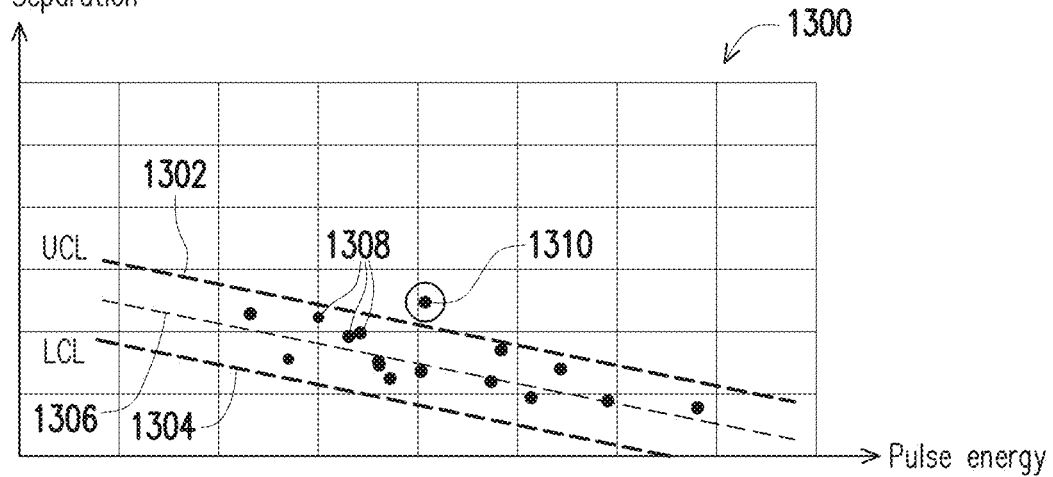
FIG. 13 is a graph illustrating separation distance of the flattening pulse and the plasmatizing pulse versus the energy of the flattening pulse, in accordance with some embodiments.

FIG. 13 is a graph 1300 illustrating separation distance of the flattening pulse and the plasmatizing pulse versus the energy of the flattening pulse, in accordance with some embodiments. The graph 1300 illustrates an upper control limit 1302 and a lower control limit 1304. Separation distances and pulse energies that fall between the upper control limit 1302 and the lower control limit 1304 result in good laser targeting and good plasma generation, in some embodiments. The graph 1300 also illustrates a line 3006 midway between the upper control limit 1302 and the lower control limit 1304. The graph 1300 illustrates a plurality of data points 1308 that fall between the upper control limit 1302 and the lower control limit 1304. The graph 1300 illustrates a single data point 1310 that is above the upper control limit. The data point 1310 corresponds to a process for which parameter adjustment data will be generated in order to ensure that a next process falls between the upper control limit 1302 and the lower control limit 1304.

In some embodiments, the separation distances range between 4 μm and 12 μm. In some embodiments, the energy of the flattening pulse ranges between 0.00088 and 0.0168 atomic units. Other separation distances and energies can be utilized without departing from the scope of the present disclosure.

Figure 14:
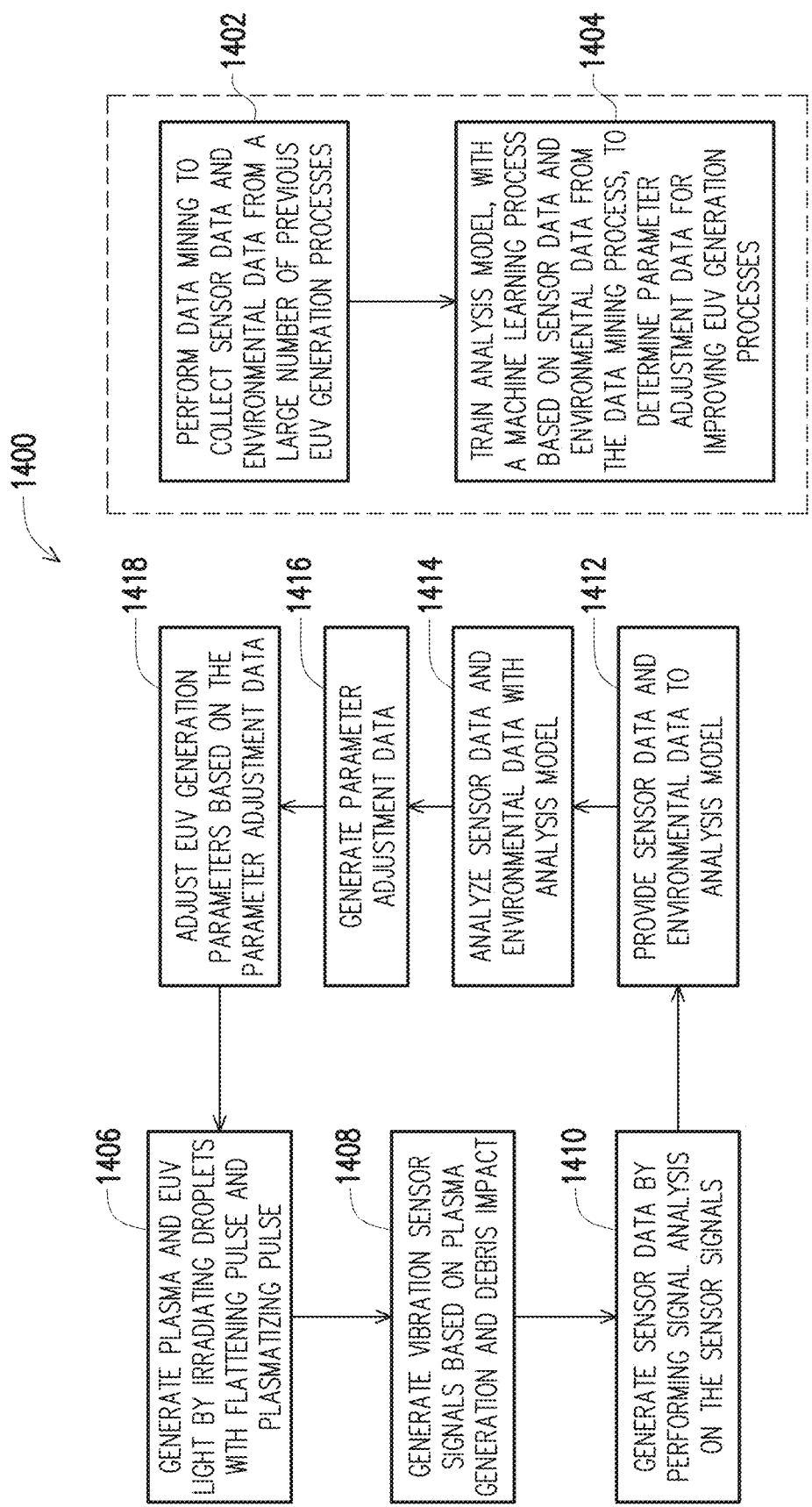
FIG. 14 is a flow diagram of a method for operating an EUV light generation system, in accordance with some embodiments.

FIG. 14 is a flow diagram of a method 1400 for operating an EUV light generation system, in accordance with some embodiments. FIG. 14 may be particularly relevant to steps 314 and 316 of the method 300 of FIG. 3, though the principles of FIG. 14 may be utilized with other processes, systems, and components without departing from the scope of the present disclosure.

At 1402, a big data mining process is performed to collect historical EUV light generation parameter data related to a large number of previously performed EUV light generation processes. The historical EUV light generation parameters can include sensor data from vibration sensors, laser pulse parameters related to the energy, timing, and possession of the flattening pulse and the plasmatizing pulse, and droplet parameters related to a size, velocity, temperature, and spacing of droplets. The historical EUV light generation parameters can include environmental data including material information, thermal information, fluid information, pressure information and other environmental information such as those mentioned in relation to FIG. 5. The historical EUV light generation parameters data can also include label data indicating whether each EUV light generation process was satisfactory.

At 1404, an analysis model is trained with a machine learning process based on the historical sensor data and the environmental data from the data mining process of step 1402. The machine learning process trains the analysis model to generate parameter adjustment data. The parameter adjustment data indicates an adjustment to one or more EUV light generation parameters that will result in improved EUV light generation. Further details regarding the machine learning process will be set forth in relation to FIG. 15.

An example adjustment may include, if the sensor data indicates bad targeting, adjusting the laser alignment. If the sensor data indicates a droplet satellite, the adjustment may include adjusting a velocity of the droplets 128. If the sensor data indicates bad size of the flattened droplet, the adjustment may include decreasing the flattening pulse energy. The sensor data indicates an undesirable tilting angle of the flattened droplet, the adjustment may include adjusting laser sensor to droplet sensor distance. If the sensor data indicates bad flattening pulse timing, the adjuster may include adjusting the flattening pulse firing time. If the sensor data indicates not enough energy in the flattening pulse, and the adjustment may include increasing the flattening pulse power. If the sensor data indicates low plasmatizing pulse energy, the adjustment may include adjusting the plasmatizing pulse power. If the sensor data indicates that flattened droplet direction, the adjustment may include adjusting a Y axis position of the flattening pulse of laser. If the sensor data indicates an undesirable droplet debris on the collector or enclosure, the adjuster may include adjusting the Z axis position of one or both of the plasmatizing laser and the flattening laser. If the sensor data indicates collector contamination, the adjustment may include adjusting the flattened droplet angle by adjusting the position of the flattening laser. Other adjustments can be made for these and other issues indicated by the sensor data without departing from the scope of the present disclosure.

After the analysis module has been trained with a machine learning process in step 1404, the analysis module is ready to improve the function of an EUV light generation system. At 1406, the method 1400 includes generating plasma and EUV light by irradiating droplets with flattening pulses and plasmatizing pulses. At 1408, the method 1400 includes generating vibration sensor signals based on plasma generation shockwaves and debris impact. At 1410, the method 1400 includes generating sensor data by performing signal analysis on the sensor signals. At 1412, the method 1400 includes providing sensor data and the environmental data related to the current plasma generation process to the analysis model. At 1414, the analysis model analyzes the sensor data and the environmental data. At 1416, the analysis model generates parameter adjustment data. At 1418, the control module adjust EUV light generation parameters based on the parameter adjustment data. The process then returns to 1406 where plasma EUV light are generated with the adjustment parameters. This process can repeat continually until the sensor data indicates satisfactory EUV light generation.

Figure 15:
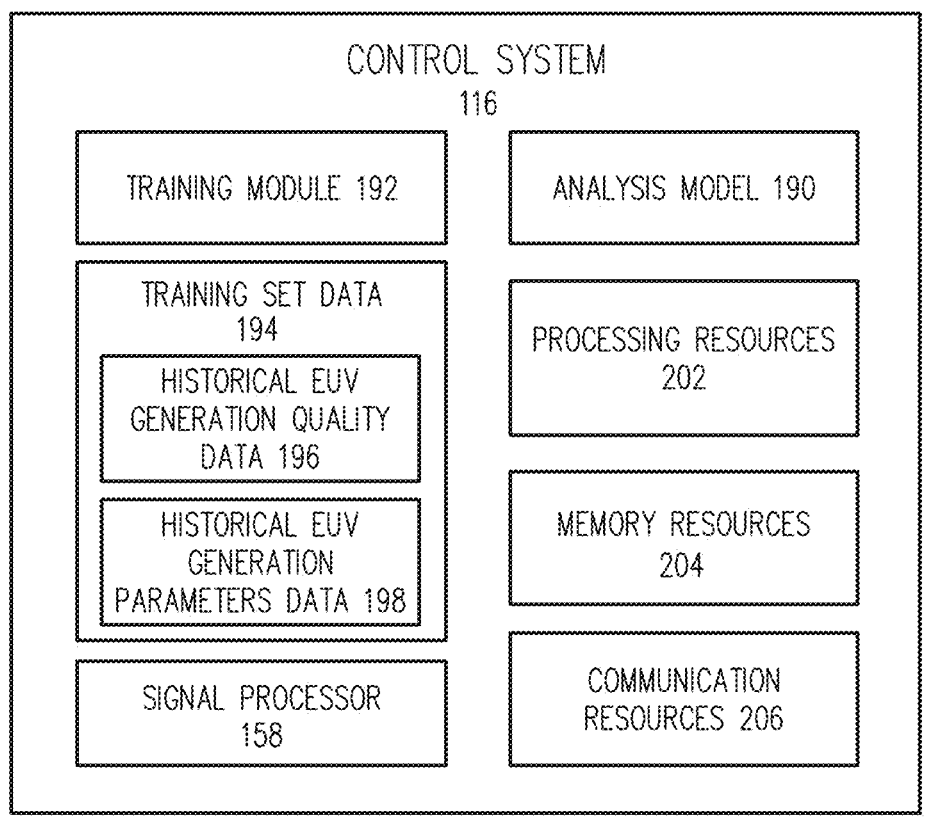
FIG. 15 is a block diagram of a control system, in accordance with some embodiments.

FIG. 15 is a block diagram of a control system 116, in accordance with some embodiments. The control system 116 of FIG. 15 is one example of the control system 116 of FIG. 1. The control system 116 is configured to control operation of a EUV light generation system, such as the EUV light generation system 100 of FIG. 1, or the EUV light generation system 200 of FIGS. 2A and 2B, in accordance with some embodiments. The control system 116 utilizes machine learning to adjust parameters of the EUV light generation system. The control system 116 can adjust parameters of the EUV light generation system to maintain high quality EUV light generation.

In one embodiment, the control system 116 includes an analysis model 190 and a training module 192. The training module 192 trains the analysis model 190 with a machine learning process. The machine learning process trains the analysis model 190 to predict future EUV light generation quality and to select parameters for a EUV light generation process that will result in a high EUV light generation quality. Although the training module 192 is shown as being separate from the analysis model 190, in practice, the training module 192 may be part of the analysis model 190. While the description of FIG. 15 is directed primarily to generating EUV parameter adjustments, the principles of FIG. 15 can be utilized to train the analysis model 190 to predict debris contamination on the collector 114 or the enclosure 124 and to adjust fluid flow parameters or EUV light generation parameters to reduce debris contamination.

The control system 116 includes, or stores, training set data 194. The training set data 194 includes historical EUV light generation quality data 196 and historical EUV light generation parameters data 198. The historical EUV light generation quality data 196 indicates whether each historical EUV light generation process was satisfactory or not. The historical EUV light generation parameters data 198 includes data related to process conditions or parameters during the EUV light generation processes associated with the historical EUV light generation quality data. As will be set forth in more detail below, the training module 192 utilizes the historical EUV light generation quality data 196 and the historical EUV light generation parameters data 198 to train the analysis model 190 with a machine learning process.

In one embodiment, the historical EUV light generation quality data 196 includes data indicating the quality of EUV light generation processes. For example, during operation of a semiconductor fabrication facility, thousands or millions of semiconductor wafers may be processed over the course of several months or years. A correspondingly large number of EUV light generating processes are performed on processing the wafers. EUV light generation processes are performed to generate light for EUV photolithography processes. The historical EUV light generation quality data 196 includes the EUV light generation quality for these EUV light generation processes, or for selected time periods during which EUV light generation was performed.

In one embodiment, the historical EUV light generation parameters data 196 include various process conditions or parameters during the EUV light generation processes associated with the historical EUV light generation quality data 196. Accordingly, for each EUV light generation quality value in the historical EUV light generation quality data 196, the historical EUV light generation parameters data 198 can include the process conditions or parameters that were present during the period of time associated with that EUV light generation quality value. The historical EUV light generation parameters data 198 can include sensor data from vibrational sensor and environmental data related to the laser parameters, droplet parameters, temperature parameters, material parameters, fluid flow parameters, and pressure parameters as set forth previously. The historical EUV light generation parameters data 198 can include environmental data of the types described in relation to FIG. 5 above.

In one embodiment, the training set data 194 links the historical EUV light generation quality data 196 with the historical EUV light generation parameters data 198. In other words, each EUV light generation quality value in the historical EUV light generation quality data 196 is linked to the process conditions data associated with the EUV light generation process. In this way, the historical EUV light generation quality values are labels for a machine learning process. As will be set forth in more detail below, the labeled training set data can be utilized in a machine learning process to train the analysis model 190 to generate recommended parameter adjustment data to improve future EUV light generation processes.

In one embodiment the analysis model 190 includes a neural network. The neural network may include a random forest network or other types of neural networks. Training of the analysis model 190 will be described in relation to a neural network. However, other types of analysis models or algorithms can be used without departing from the scope of the present disclosure. The training module 192 utilizes the training set data 194 to train the neural network with a machine learning process. During the training process, the neural network receives, as input, historical EUV light generation parameters data 198 from the training set data. During the training process, the neural network outputs predicted EUV light generation quality data. The predicted EUV light generation quality data predicts EUV light generation quality that will result from the historical EUV light generation parameters data. The training process trains the neural network to generate predicted EUV light generation quality data. The training process also trains the neural network to generate recommended parameter adjustment data to improve EUV light generation quality.

In one embodiment, the neural network includes a plurality of neural layers. The various neural layers include neurons that define one or more internal functions. The internal functions are based on weighting values associated with neurons of each neural layer of the neural network. During training, the control system 116 compares, for each set of historical EUV light generation parameters data, the predicted EUV light generation quality data to the actual historical EUV light generation quality data associated with those process conditions. The control system generates an error function indicating how closely the predicted EUV light generation quality data matches the historical EUV light generation quality data. The control system 116 then adjusts the internal functions of the neural network. Because the neural network generates predicted EUV light generation quality data based on the internal functions, adjusting the internal functions will result in the generation of different predicted EUV light generation quality data for a same set of historical EUV light generation parameters data. Adjusting the internal functions can result in predicted EUV light generation quality data that produces larger error functions (worse matching to the historical EUV light generation quality data 196) or smaller error functions (better matching to the historical EUV light generation quality data 196).

After adjusting the internal functions of the neural network, the historical EUV light generation parameters data 198 is again passed to the neural network and the analysis model 190 again generates predicted EUV light generation quality data. The training module 192 again compares the predicted EUV light generation quality data to the historical EUV light generation quality data 196. The training module 192 again adjusts the internal functions of the neural network. This process is repeated in a very large number of iterations of monitoring the error functions and adjusting the internal functions of the neural network until a set of internal functions is found that results in predicted EUV light generation quality data that matches the historical EUV light generation quality data 196 across the entire training set.

At the beginning of the training process, the predicted EUV light generation quality data likely will not match the historical EUV light generation quality data 196 very closely. However, as the training process proceeds through many iterations of adjusting the internal functions of the neural network, the errors functions will trend smaller and smaller until a set of internal functions is found that results in predicted EUV light generation quality data that match the historical EUV light generation quality data 196. Identification of a set of internal functions that results in predicted EUV light generation quality data that matches the historical EUV light generation quality data 196 corresponds to completion of the training process.

In one embodiment, the analysis model 190 includes two neural networks coupled together in an encoder decoder configuration. The encoder neural network is trained with the training process described above to generate predicted EUV light generation quality. The decoder network is trained to receive the predicted EUV light generation quality and to reproduce the historical EUV light generation parameters data 198 that resulted in the predicted EUV light generation quality.

The training of the decoder neural network is similar to the training of the encoder neural network. The decoder neural networks includes a plurality of neural layers as described above in relation to the encoder neural network. The decoder neural network receives as input a EUV light generation quality value and generates as output historical predicted EUV light generation parameters. The training process utilizes the historical EUV light generation parameters data 198 as labels. For each EUV light generation quality value, the decoder neural network generates predicted EUV light generation parameters. The predicted EUV light generation parameters are compared to the historical EUV light generation parameters data and an error function is generated. The internal functions of the decoder neural network are adjusted in iterations until the decoder neural network can generate predicted EUV light generation parameters data that matches the historical EUV light generation parameters data 198 within an error tolerance.

In one embodiment, after the analysis model 190 has been trained, the analysis model 190 can be utilized to generate sets of recommended process conditions that will result in improved EUV light generation. For example, current EUV light generation process conditions or parameters are provided to the encoder neural network of the analysis model 190. The encoder neural network generates a predicted future EUV light generation quality based on the current EUV light generation process conditions or parameters. If the predicted future EUV light generation quality is lower than a selected threshold, a higher EUV light generation quality value can be provided to the decoder neural network. The decoder neural network will then generate a set of recommended EUV light generation parameter adjustments that will result in the higher EUV light generation quality. The control system 116 can then adjust the operation of the various components of the EUV light generation system to implement the recommended EUV light generation parameter adjustments.

In one embodiment, the control system 116 includes processing resources 202, memory resources 204, and communication resources 206. The processing resources 202 can include one or more controllers or processors. The processing resources 202 are configured to execute software instructions, process data, make parameter control decisions, perform signal processing, read data from memory, write data to memory, and to perform other processing operations. The processing resources 202 can include physical processing resources 202 located at a site or facility of the EUV light generation system. The processing resources can include virtual processing resources 202 remote from the site EUV light generation system or a facility at which the EUV light generation system is located. The processing resources 202 can include cloud-based processing resources including processors and servers accessed via one or more cloud computing platforms.

In one embodiment, the memory resources 204 can include one or more computer readable memories. The memory resources 204 are configured to store software instructions associated with the function of the control system and its components, including, but not limited to, the analysis model 190. The memory resources 204 can store data associated with the function of the control system 116 and its components. The data can include the training set data 194, current process conditions data, and any other data associated with the operation of the control system 116 or any of its components. The memory resources 204 can include physical memory resources located at the site or facility of the EUV light generation system. The memory resources can include virtual memory resources located remotely from site or facility of the EUV light generation system. The memory resources 204 can include cloud-based memory resources accessed via one or more cloud computing platforms.

In one embodiment, the communication resources can include resources that enable the control system 116 to communicate with components associated with the EUV light generation system. For example, the communication resources 206 can include wired and wireless communication resources that enable the control system 116 to receive the sensor signals from the vibration sensors and to control equipment of the EUV light generation system such as the flattening and plasmatizing lasers, the droplet generators, and fluid flow equipment The communication resources 206 can enable the control system 116 to communicate with remote systems. The communication resources 206 can include, or can facilitate communication via, one or more networks such as wire networks, wireless networks, the Internet, or an intranet. The communication resources 206 can enable components of the control system 116 to communicate with each other.

In one embodiment, the analysis model 190 is implemented via the processing resources 202, the memory resources 204, and the communication resources 206. The control system 116 can be a dispersed control system with components and resources and locations remote from each other and from the EUV light generation system.

In some embodiments, the control system 116 includes the signal processor 158 described in relation to FIG. 5. In this example, the vibration sensors 118 provide sensor signals to the control system 116. The signal processor 158 then performs signal processing on the sensor signals and generates the previously described sensor data. In some embodiments, the signal processor 158 may be external to the control system 116.

Figure 16:
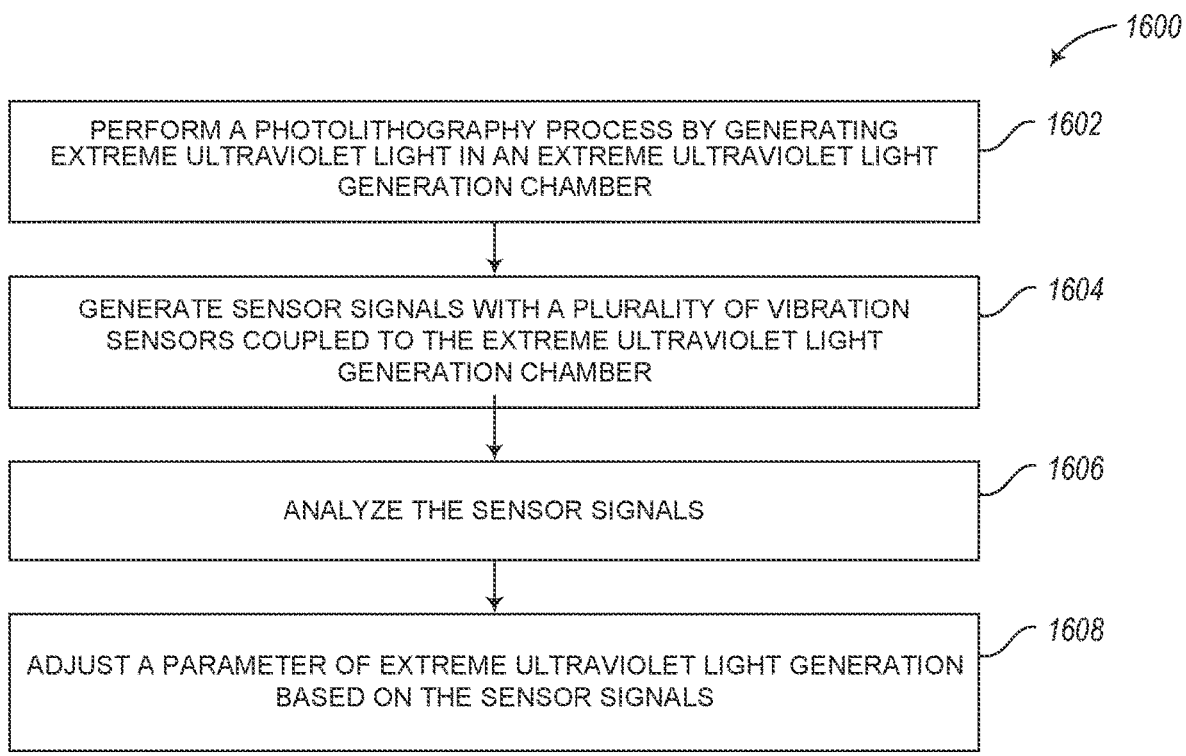
FIG. 16 is a flow diagram of a method for operating an EUV photolithography system, in accordance with some embodiments.

FIG. 16 is a flow diagram of a method 1600 for operating an EUV photolithography system, in accordance with some embodiments. The method 1600 can utilize systems, components, and processes described in relation to FIGS. 1-15. At 1602, the method includes performing a photolithography process by generating extreme ultraviolet light in an extreme ultraviolet light generation chamber. One example of an extreme ultraviolet generation chamber is the extreme ultraviolet light generation chamber 104 of FIG. 1. At 1604, the method includes generating sensor signals with a plurality of vibration sensors coupled to the extreme ultraviolet light generation chamber. One example of vibration sensors are the vibration sensors 118 of FIG. 2A. At 1606, the method includes analyzing the sensor signals. At 1608, the method includes adjusting a parameter of extreme ultraviolet light generation based on the sensor signals.

Figure 17:
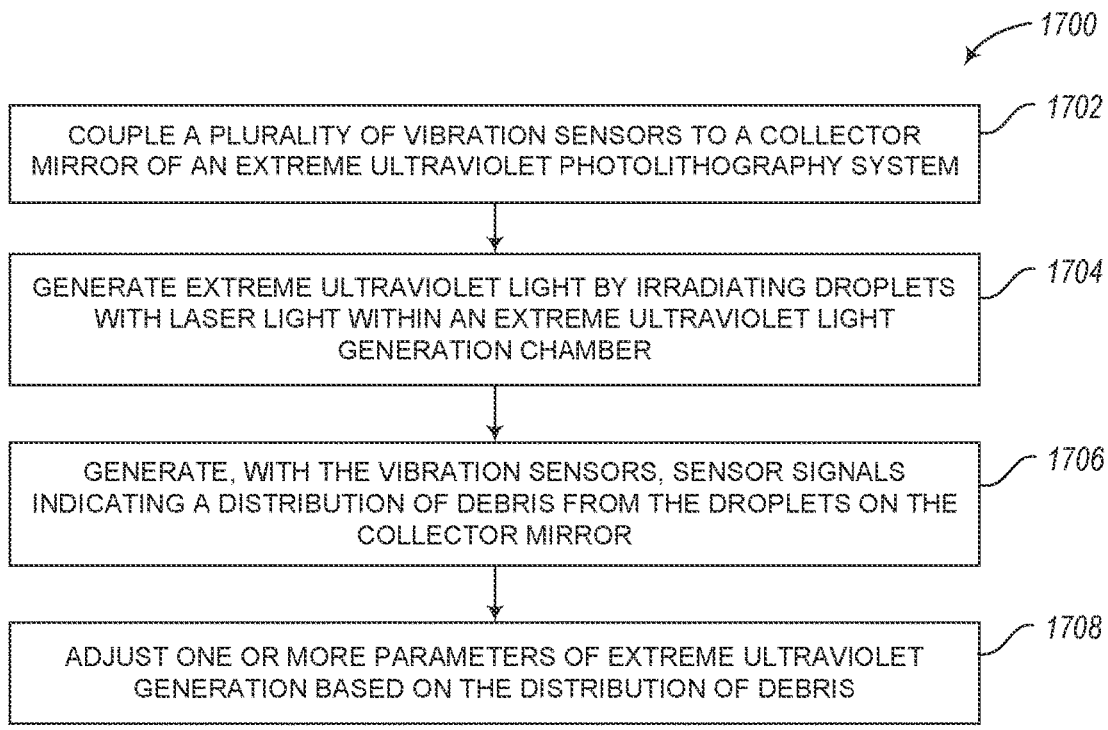
FIG. 17 is a flow diagram of a method for operating an EUV photolithography system, in accordance with some embodiments.

FIG. 17 is a flow diagram of a method 1700 for operating an EUV photolithography system, in accordance with some embodiments. The method 1700 can utilize systems, components, and processes described in relation to FIGS. 1-16. At 1702, the method includes coupling a plurality of vibration sensors to a collector mirror of an extreme ultraviolet photolithography system. One example of vibration sensors are the vibration sensors 118 of FIG. 2A. One example of a collector mirror is the collector mirror 114 of FIG. 2A. At 1704, the method 1700 includes generating extreme ultraviolet light by irradiating droplets with laser light within an extreme ultraviolet light generation chamber. One example of droplets are the droplets 128 of FIG. 2A. One example of an extreme ultraviolet light generation chamber is the extreme ultraviolet light generation chamber of FIG. 2A. At 1706, the method includes generating, with the vibration sensors, sensor signals indicating a distribution of debris from the droplets on the collector mirror. At 1708, the method 1700 includes adjusting one or more parameters of extreme ultraviolet generation based on the distribution of debris.

In some embodiments, a method includes performing a photolithography process by generating extreme ultraviolet light in an extreme ultraviolet light generation chamber and generating sensor signals with a plurality of vibration sensors coupled to the extreme ultraviolet light generation chamber. The method includes analyzing the sensor signals and adjusting a parameter of extreme ultraviolet light generation based on the sensor signals.

In some embodiments, a method includes coupling a plurality of vibration sensors to a collector mirror of an extreme ultraviolet photolithography system and generating extreme ultraviolet light by irradiating droplets with laser light within an extreme ultraviolet light generation chamber. The method includes generating, with the vibration sensors, sensor signals indicating a distribution of debris from the droplets on the collector mirror and adjusting one or more parameters of extreme ultraviolet generation based on the distribution of debris.

In some embodiments, an extreme ultraviolet photolithography system includes a droplet generator configured to output droplets into an extreme ultraviolet light generation chamber and a laser configured to generate a plasma from the droplets by irradiating the droplets with laser light. The system includes a collector mirror configured to focus extreme ultraviolet light emitted from the plasma and a plurality of first vibration sensors coupled to the collector mirror.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
performing a photolithography process by generating extreme ultraviolet light in an extreme ultraviolet light generation chamber, wherein generating extreme ultraviolet light includes generating extreme ultraviolet light by generating a plasma from droplets within the extreme ultraviolet light generation chamber;
generating sensor signals with a plurality of vibration sensors coupled to the extreme ultraviolet light generation chamber, wherein the plurality of vibration sensors are coupled to a collector mirror of the extreme ultraviolet light generation chamber;
analyzing the sensor signals; and
adjusting a parameter of extreme ultraviolet light generation based on the sensor signals.

2. The method of claim 1, further comprising determining characteristics of the plasma based on the sensor signals.

3. The method of claim 2, wherein generating the plasma includes: irradiating the droplets with laser light, wherein adjusting a parameter of extreme ultraviolet light generation includes adjusting a parameter of the laser light based on the sensor signals.

4. The method of claim 2, wherein adjusting a parameter of extreme ultraviolet light generation includes adjusting a parameter of the droplets.

5. The method of claim 2, further comprising:
detecting a distribution of droplet debris on the collector mirror based on the sensor signals; and
determining characteristics of the plasma based on the distribution of droplet debris.

6. The method of claim 5, wherein determining characteristics of the plasma includes generating a model of the plasma.

7. The method of claim 5, wherein irradiating the droplets with laser light includes:
irradiating each droplet with a first laser pulse; and
irradiating each droplet with a second laser pulse, wherein the sensor signals are indicative of shockwaves from the first laser pulse and shockwaves from the second laser pulse.

8. The method of claim 7, further comprising determining characteristics of the plasma based on the shockwaves from the first laser pulse and the shockwaves from the second laser pulse.

9. The method of claim 1, further comprising:
generating sensor data based on the sensor signals;
passing the sensor signals to an analysis model trained with a machine learning process;
generating, with the analysis model, parameter adjustment data identifying the parameter of radiation generation to be adjusted; and
adjusting the parameter of radiation generation responsive to parameter adjustment data.

10. The method of claim 1, wherein the droplets are tin.

11. A method, comprising:
coupling a plurality of vibration sensors to a collector mirror of an extreme ultraviolet photolithography system;
generating extreme ultraviolet light by irradiating droplets with laser light within an extreme ultraviolet light generation chamber;
generating, with the vibration sensors, sensor signals indicating a distribution of debris from the droplets on the collector mirror; and
adjusting one or more parameters of extreme ultraviolet light generation based on the distribution of debris.

12. The method of claim 11, further comprising:
storing historical radiation generation data corresponding to data from a plurality of previously performed extreme ultraviolet light generation processes; and
training, with the historical extreme ultraviolet light generation data, an analysis model with a machine learning process to generate parameter adjustment data for adjusting parameters of extreme ultraviolet light generation processes.

13. The method of claim 12, further comprising:
generating sensor data from the sensor signals;
providing the sensor data to the analysis model;
generating, with the analysis model, parameter adjustment data; and
adjusting extreme ultraviolet generation parameters in accordance with the parameter adjustment data.

14. The method of claim 12, wherein the droplets are tin.

15. The method of claim 11, further comprising performing a Fourier transform on the sensor signals.

16. An extreme ultraviolet photolithography system, comprising:
a droplet generator configured to output droplets into an extreme ultraviolet light generation chamber;
a laser configured to generate a plasma from the droplets by irradiating the droplets with laser light;
a collector mirror configured to focus extreme ultraviolet light emitted from the plasma; and
a plurality of first vibration sensors coupled to the collector mirror.

17. The extreme ultraviolet photolithography system of claim 16, further comprising:
an enclosure cone coupled to the collector mirror, the enclosure cone and the collector mirror collectively defining the extreme ultraviolet light generation chamber; and
a plurality of second vibration sensors coupled to the enclosure cone.

18. The system of claim 16, wherein the plurality of first vibration sensors are arrayed in a grid on a backside of the collector mirror.

19. The system of claim 16, further comprising a control system configured to receive sensor signals from the first vibration sensors, to analyze the sensor signals, and to adjust parameters of one or both of the droplet generator and the laser based on the sensor signals.

20. The system of claim 19, wherein the control system includes an analysis model trained with a machine learning process and configured to analyze the sensor signals.

* * * * *